(12) United States Patent
Tagi et al.

(10) Patent No.: US 8,119,919 B2
(45) Date of Patent: Feb. 21, 2012

(54) PRINTED WIRING BOARD, METHOD FOR MANUFACTURING PRINTED WIRING BOARD, AND ELECTRIC DEVICE

(75) Inventors: Hiroyoshi Tagi, Osaka (JP); Eiji Takahashi, Nara (JP); Yoshiyuki Saito, Osaka (JP)

(73) Assignee: Panasonic Corporation, Osaka (JP)

( * ) Notice: Subject to any disclaimer, the term of this patent is extended or adjusted under 35 U.S.C. 154(b) by 423 days.

(21) Appl. No.: 12/376,862

(22) PCT Filed: Oct. 22, 2007

(86) PCT No.: PCT/JP2007/070524
§ 371 (c)(1),
(2), (4) Date: Feb. 9, 2009

(87) PCT Pub. No.: WO2008/050706
PCT Pub. Date: May 2, 2008

(65) Prior Publication Data
US 2010/0163282 A1    Jul. 1, 2010

(51) Int. Cl.
*H05K 1/00*    (2006.01)
(52) U.S. Cl. ......................... 174/254; 174/260
(58) Field of Classification Search .................. 174/254, 174/255, 260, 261, 262
See application file for complete search history.

(56) References Cited

U.S. PATENT DOCUMENTS

| | | | |
|---|---|---|---|
| 5,397,862 A | 3/1995 | Bockelman et al. | |
| 5,430,247 A * | 7/1995 | Bockelman | 174/33 |
| 6,300,846 B1 * | 10/2001 | Brunker | 333/1 |
| 6,841,738 B2 * | 1/2005 | Michiwaki et al. | 174/254 |
| 7,271,985 B1 * | 9/2007 | Buhler et al. | 360/245.9 |

FOREIGN PATENT DOCUMENTS

| | | |
|---|---|---|
| JP | 62-145362 | 9/1987 |
| JP | 4-223389 | 8/1992 |
| JP | 5-120928 | 5/1993 |
| JP | 9-502304 | 3/1997 |
| JP | 2000-151041 | 5/2000 |
| JP | 2001-060746 | 3/2001 |
| JP | 2001-267701 | 9/2001 |
| JP | 2002-204042 | 7/2002 |
| WO | WO 95/06946 | 3/1995 |

* cited by examiner

*Primary Examiner* — Thanh Tam Le
(74) *Attorney, Agent, or Firm* — McDermott Will & Emery LLP

(57) ABSTRACT

Provided are a printed wiring board and a flexible printed wiring board which hardly generate radiation electromagnetic noises and are not easily affected by external noises. First and second wave-shape wirings are provided between at least two insulation substrates stacked on each other. The first and the second wave-shape wirings three-dimensionally intersect with each other in a plane direction and a thickness direction of the insulating substrates. The first and second wave-shape wirings are electrically separated from each other by a resist layer provided between the insulating substrates.

21 Claims, 11 Drawing Sheets

PRINTED WIRING BOARD, METHOD FOR MANUFACTURING PRINTED WIRING BOARD, AND ELECTRIC DEVICE

RELATED APPLICATIONS

This application is the U.S. National Phase under 35 U.S.C. §371 of International Application No. PCT/JP2007/070524, filed on Oct. 22, 2007, which in turn claims the benefit of Japanese Application No. 2006-288493, filed on Oct. 24, 2006, the disclosures of which Applications are incorporated by reference herein.

FIELD OF THE INVENTION

The present invention relates to a printed wiring board and a flexible printed wiring board for which noise reduction measures have been taken.

BACKGROUND OF THE INVENTION

As electronic devices have been reduced in size and increasingly highly integrated in recent years, radiated electromagnetic noises tend to be generated in a printed board used in the electronic devices and a flexible printed wiring board which connects the printed boards, and these boards are easily affected by external noises.

An example of a measure for reducing the generation and influence of the electromagnetic noises is a twisted pair structure wherein a differential wiring is used. In the Patent Document 1, for example, a structure illustrated in FIG. 6 (hereinafter, referred to as a first conventional example) was proposed as a structure of the flexible printed wiring board in which the electromagnetic noises are reduced. According to the first conventional example, a wiring pattern layer provided on a surface side of a flexible printed wiring board having a bilayer structure is patterned so that a plurality of surface wirings 528 in parallel with one another and tilted downward from left to right are obtained, a wiring pattern layer provided on a rear-surface side thereof is patterned so that a plurality of rear-surface wirings 529 intersecting with the surface wirings 528, in parallel with one another, and tilted upward from left to right (viewed from the surface side) are obtained, and end portions of the surface wirings 528 and the rear-surface wirings 529 are connected through inter-layer connection vias 530. As a result, the twisted pair structure is formed as a whole.

The Patent Document 2 proposed a structure illustrated in FIGS. 7A and 7B (hereinafter, referred to as a second conventional example) as a structure of a flexible printed wiring board in which the electromagnetic noises are reduced. According to the second conventional example, a first wiring pattern 602 and a second wiring pattern 603, for which a signal having a phase electrically different to that of the first wiring pattern 603 through 180 degrees is driven, are formed in a wave shape on a wiring pattern layer provided on a surface side of a flexible printed wiring board having a monolayer structure, and the twisted pair structure is formed so that the phase difference between the first wiring pattern 602 and the second wiring pattern 603 is 180 degrees when the wiring board is bent along a bending line 618.

Patent Document 1: 2001-60746 of the Japanese Patent Applications laid-Open

Patent Document 2: 2002-204042 of the Japanese Patent Applications laid-Open

DISCLOSURE OF THE INVENTION

Problems to be Solved by the Invention

When the conventional technologies described above are adopted, the generation and influence of the electromagnetic noises can be reduced; however, the following problems are still left unsolved. The first conventional example is disadvantageous in that manufacturing costs of the wiring board are increased because it is necessary to use the inter-layer connection vias to form the twisted pair structure. The second conventional example is disadvantageous in that a distance between the first wiring pattern 602 and the second wiring pattern 603 is not constant because the wiring board is bent to form the twisted pair structure, and the characteristics of differential signals are deteriorated due to transmission by the first wiring pattern 602 and the second wiring pattern 603. The constitution recited in the first conventional example, wherein the twisted pair structure is formed in a plane direction and a cross-sectional direction of the wiring board, is durable against the external electromagnetic noises in the plane direction and the cross-sectional direction of the wiring board. However, the constitution recited in the second conventional example, wherein the twisted pair structure is two-dimensionally provided, is only durable against the external electromagnetic noises in the cross-sectional direction of the wiring board.

A main object of the present invention is to provide a wiring board capable of effectively reducing electromagnetic noises and minimizing cost increases by improving the electromagnetic noise reduction which is inadequate in the conventional printed wiring board and flexible printed wiring board.

Means for Solving the Problem

A printed wiring board according to the present invention comprises:

at least two insulation substrates stacked on each other;

a first wave-shape wiring provided between the insulation substrates facing each other;

a second wave-shape wiring provided between the insulation substrates facing each other and three-dimensionally intersecting with the first wave-shape wiring in a plane direction and a thickness direction of the insulation substrates; and a resist layer provided between the insulation substrates and electrically separating the first wave-shape wiring and the second wave-shape wiring from each other.

According to the present invention thus constituted, a printed wiring board capable of preventing the deterioration of characteristics of a differential wiring, resistant to external electromagnetic noises in a plane direction and a cross-sectional direction of the wiring board and having low noise radiation characteristics can be obtained.

Preferably, any of a thermal-bonding portion in internal wirings of the first wave-shape wiring or the second wave-shape wiring, solder, solder paste, and a conductive adhesive constitutes an electric connection member which internally connect the first wave-shape wiring and the second wave-shape wiring. Accordingly, the distance between the first wave-shape wiring and the second wave-shape wiring is substantially constant, which prevents the deterioration of the characteristics of the differential signals.

The printed wiring board according to the present invention preferably comprises at least three pieces of the insulation substrates multilayered on one another, wherein the first wave-shape wiring, the second wave-shape wiring and the resist layer are provided in each of a plurality of interlayer spaces of the insulation substrates, and the first wave-shape wirings adjacent to each other and the second wave-shape wirings adjacent to each other in the thickness direction of the insulation substrates are disposed at such positions that the first wave-shape wirings adjacent to each other and the second wave-shape wirings adjacent to each other are plane-symmetrical to each other relative to a bonding surface of the insulation substrates.

Accordingly, a pseudo twisted pair structure can be multilayered in a thickness direction of the printed wiring board, and the noises radiated in the thickness direction of the wiring board can be thereby further reduced. At the time, it is important that the two pseudo twisted pair structures are disposed at substantially the same location and have a mirror-image relationship therebetween. If phases of the pseudo twisted pairs are equal to each other, the reduction of the radiated noises cannot be effectively obtained. Furthermore, although the constitution described above is effective for the reduction of the radiated noises, cross talk noises between the differential wirings are increased in the case where the pseudo twisted pair structures continuously provided in the thickness direction of the substrates are too close to each other, which results in the deterioration of a signal quality. When the present invention is implemented, therefore, it is preferable to figure out a most suitable distance that reduces the cross talk noises and the radiated noises using a simulator or the like.

According to the present invention, the printed wiring board capable of reducing deterioration of the characteristics of the differential wiring without any increase in costs, resistant to the external electromagnetic noises in the plane direction and the cross-sectional direction of the wiring board and having low noise radiation characteristics can be obtained.

When a plurality of pseudo twisted pair structures formed by the rectangular wave-shape wirings are provided, and the flexible printed wiring board is bent a plurality of times so that the pseudo twisted pair structures are continuously provided in the cross-sectional direction of the flexible printed wiring board, the noises radiated in the cross-sectional direction of the wiring board can be reduced. At the time, it is important that the pseudo twisted pair structures continuously provided in the cross-sectional direction of the flexible printed wiring board are disposed at substantially the same location in the mirror-image manner. If phases of the pseudo twisted pairs are equal to each other, the reduction of the radiated noises is not as effective as expected. The constitution described above is effective for the reduction of the radiated noises; however, the cross talk noises between the differential wirings are increased in the case where the pseudo twisted pair structures continuous in the cross-sectional direction of the wiring board are too close to each other, which results in the deterioration of the signal quality. When the present invention is implemented, therefore, it is preferable to figure out a most suitable distance that reduces the cross talk noises and the radiated noises using a simulator or the like.

Effect of the Invention

According to the printed wiring board provided by the present invention, the generation and influence of the electromagnetic noises can be effectively reduced while preventing the characteristics of the differential signals from deteriorating in comparison to the conventional printed wiring board. Further, in the case where the pseudo twisted pair structures in which polarities of the electromagnetic noise radiation are different (directions to which the electromagnetic noises are radiated are different) are continuously provided in the cross-sectional direction of the printed wiring board, the generation and influence of the electromagnetic noises can be more effectively reduced.

According to the flexible printed wiring board provided by the present invention, wherein the flexible printed wiring board is bent so that the pseudo twisted pair structures are formed, the flexible printed wiring board in which the electromagnetic noises are unlikely to be generated and the influences of the electromagnetic noises can be reduced in comparison to the conventional flexible printed wiring board can be obtained without any cost increases. Further, the pseudo twisted pair structures can be formed without the deterioration of the differential signals. Further, in the case where the flexible printed wiring board is provided with at least two sets of pseudo twisted pair structures and bent a plurality of times, the pseudo twisted pair structures in which the polarities of the electromagnetic noise radiation are different (directions to which the electromagnetic noises are radiated are different) can be continuously provided in the cross-sectional direction of the printed wiring board. As a result, the generation and influence of the electromagnetic noises can be more effectively reduced.

DESCRIPTION OF REFERENCE SYMBOLS

Figure 1A:
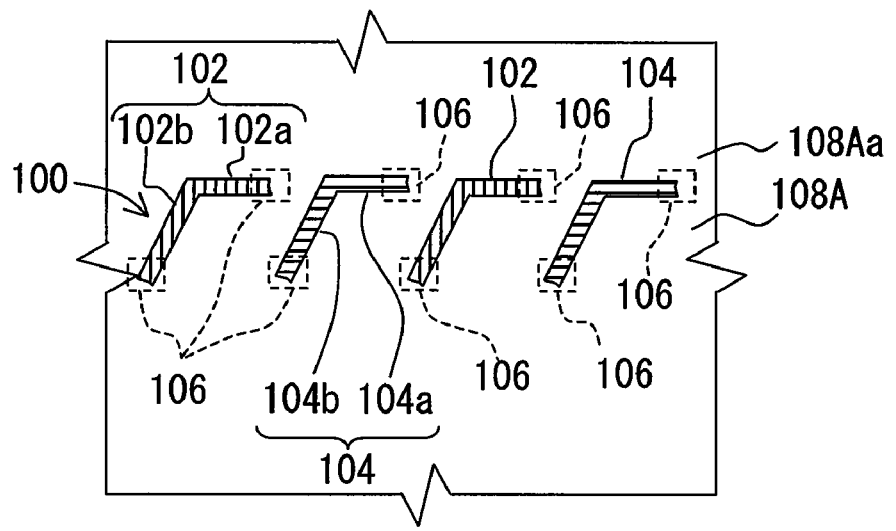
FIG. 1A illustrates a main section of a printed wiring board according to a preferred embodiment 1 of the present invention and is a plan view of a main section of a wiring pattern layer formed on a surface of one of two wiring boards.

100 first wiring pattern layer
101 second wiring pattern layer
102 first wiring pattern
102a first parallel wiring portion
102b first intersecting wiring portion
103 second wiring pattern
103a first parallel wiring portion
103b first intersecting wiring portion
104 third wiring pattern
104a first parallel wiring portion
104b first intersecting wiring portion
105 fourth wiring pattern
105a first parallel wiring portion
105b first intersecting wiring portion
108 flexible insulation substrate
108A first insulation substrate
108A' first substrate region
108B second insulation substrate
108B' second substrate region
110 first electric connection member
111 second electric connection member
112 resist layer
113 first wave-shape wiring
114 second wave-shape wiring
200 first wiring pattern layer
200A, 200B first wiring pattern layer
201 second wiring pattern layer
201A, 200B second wiring pattern layer
202A, 202B first wiring pattern
202Aa, 202Ba first parallel wiring portion
202Ab, 202Bb first intersecting wiring portion
203A, 203B second wiring pattern
203Aa, 203Ba second parallel wiring portion
203Ab, 203Bb second intersecting wiring portion
204A, 204B third wiring pattern
204Aa, 204Ba third parallel wiring portion
204Ab, 204Bb third intersecting wiring portion
205A, 205B fourth wiring pattern
205Aa, 205Ba fourth parallel wiring portion
205Ab, 205Bb fourth intersecting wiring portion
208 flexible insulation substrate
208A first insulation substrate
208A' first substrate region
208B second insulation substrate
208B' second substrate region
208C third insulation substrate
210A, 210B first electric connection member
211A, 211B second electric connection member
212A, 212B resist layer
213A, 213B first wave-shape wiring
214A, 214B second wave-shape wiring
230 auxiliary wiring

PREFERRED EMBODIMENTS OF THE PRESENT INVENTION

Hereinafter, preferred embodiments of a flexible printed wiring board according to the present invention are described below referring to each embodiment.

Preferred Embodiment 1

Figure 1B:
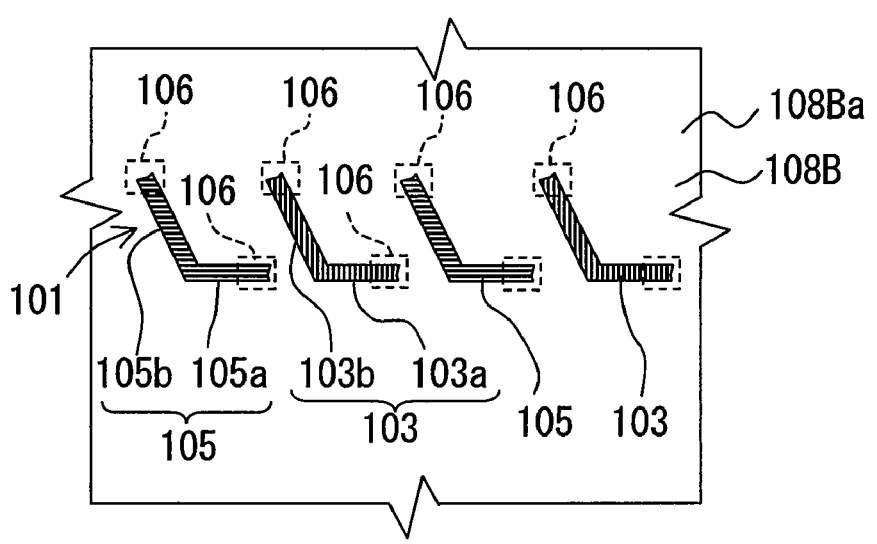
FIG. 1B illustrates the main section of the printed wiring board according to the preferred embodiment 1 and is a plan view of a main section of a wiring pattern layer formed on a surface of the other wiring board.
Figure 1C:
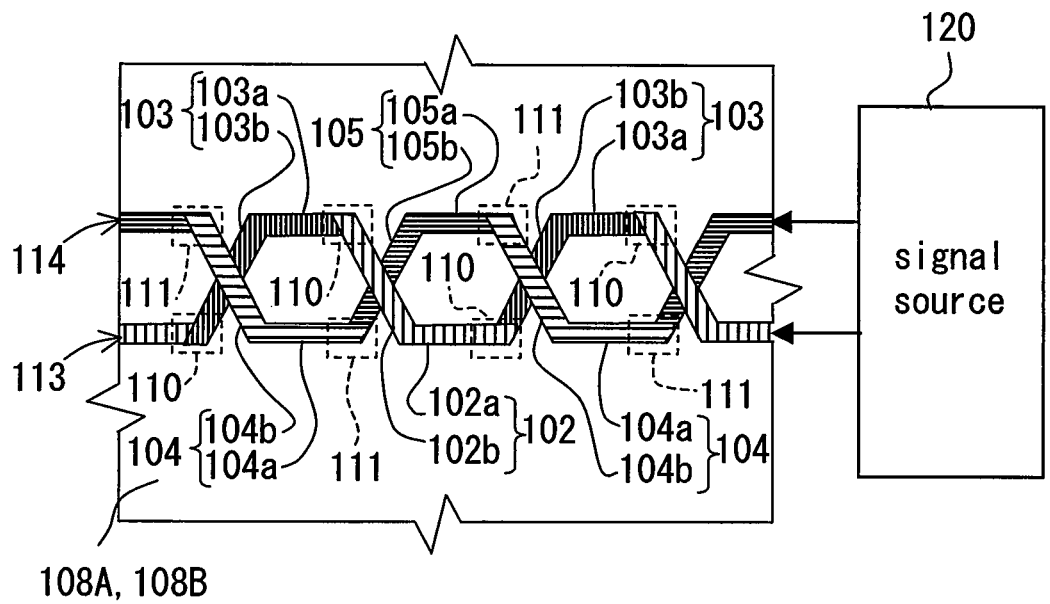
FIG. 1C is a perspective view of the main section of the printed wiring board according to the preferred embodiment 1.
Figure 1D:
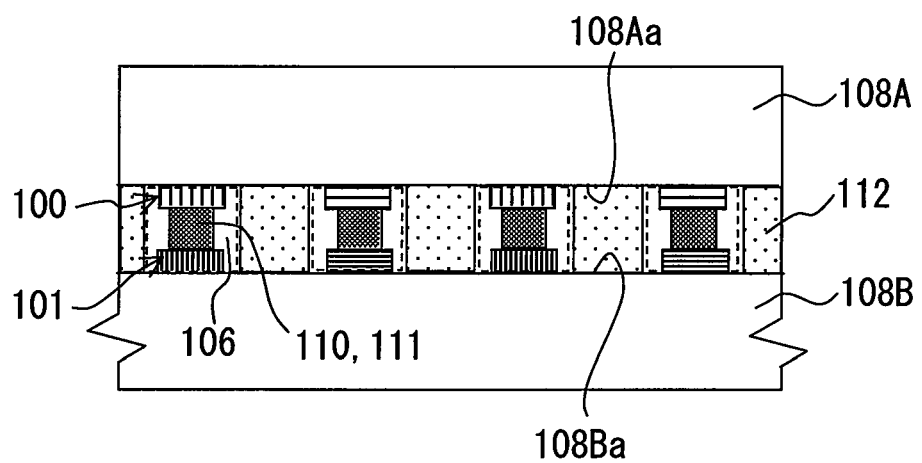
FIG. 1D is a sectional view of the main section of the printed wiring board according to the preferred embodiment 1.

FIGS. 1A-1D are illustrations of a preferred embodiment 1 of the present invention. FIG. 1A is a plan view of a first insulation substrate on which a first wiring pattern layer is formed. FIG. 1B is a rear-surface view of a second insulation substrate on which a second wiring pattern layer is formed. FIG. 1C is a perspective view of a flexible printed wiring board viewed from an upper-surface side thereof. FIG. 1D is a sectional view of the flexible printed wiring board.

In these drawings, 100 denotes a first wiring pattern layer, 101 denotes a second wiring pattern layer, 102 denotes a first wiring pattern, 103 denotes a second wiring pattern, 104 denotes a third wiring pattern, 105 denotes a fourth wiring pattern, 106 denotes a resist bore portion, 108A denotes a first insulation substrate, 108B denotes a second insulation substrate, 110 denotes a first electric connection member (solder), 111 denotes a second electric connection member (solder), 112 denotes a resist layer, 113 denotes a first wave-shape wiring, and 114 denotes a second wave-shape wiring.

The flexible printed wiring board comprises the first insulation substrate (flexible insulation substrate) 108A, second insulation substrate (flexible insulation substrate) 108B, resist layer 112, first wave-shape wiring 113, and second wave-shape wiring 114. The first insulation substrate 108A and the second insulation substrate 108B are stacked on each other with the resist layer 112, first wave-shape wiring 113 and second wave-shape wiring 114 interposed therebetween. The first wave-shape wiring 113 and the second wave-shape wiring 114 three-dimensionally intersect with each other between the insulation substrates 108A and 108B in a plane direction and a thickness direction of the substrates. The resist layer 112 is provided between the insulation substrates 108A and 108B (between the first wave-shape wiring 113 and the second wave-shape wiring 114) and electrically insulates the first wave-shape wiring 113 and the second wave-shape wiring 114 from each other.

The first wave-shape wiring 113 comprises the first wiring patterns 102 and the second wiring patterns 103. The second wave-shape wiring 114 comprises the third wiring patterns 104 and the fourth wiring patterns 105. The first wiring patterns 102 are provided on a surface 108Aa of the first insulation substrate 108A (which is a surface facing the second insulation substrate 108B). The number of the first wiring patterns 102 to be provided is at least two, and the plurality of first wiring patterns 102 have the identical pattern. These first wiring patterns 102 constitute a plurality of intermittent portions in the first wave-shape wiring 113. The second wiring patterns 103 are provided on a surface 108Ba of the second insulation substrate 108B (which is a surface facing the first insulation substrate 108A). The number of the second wiring patterns 103 to be provided is at least two, and the plurality of second wiring patterns 103 have the identical pattern. These second wiring patterns 103 constitute a plurality of intermittent portions in the first wave-shape wiring 113 other than those of the first wiring patterns 102.

The third wiring patterns 104 are provided on the surface 108Aa of the first insulation substrate 108A (which is the surface facing the second insulation substrate 108B). The number of the third wiring patterns 104 to be provided is at least two, and the plurality of third wiring patterns 104 have the identical pattern. These third wiring patterns 104 constitute a plurality of intermittent portions in the second wave-shape wiring 114. The fourth wiring patterns 105 are provided on the surface 108Ba of the second insulation substrate 108B (which is the surface facing the first insulation substrate 108A). The number of the fourth wiring patterns 105 to be provided is at least two, and the plurality of fourth wiring patterns 105 have the identical pattern. These fourth wiring patterns 105 constitute a plurality of intermittent portions in the second wave-shape wiring 114 other than those of the third wiring patterns 104.

The first wiring patterns 102 and the third wiring patterns 104 constitute the first wiring pattern layer 100 on the surface 108Aa of the first insulation substrate 108A. The second wiring patterns 103 and the fourth wiring patterns 105 constitute the second wiring pattern layer 101 on the surface 108Ba of the second insulation substrate 108B.

The first wiring patterns 102 each comprise a first parallel wiring portion 102a and a first intersecting wiring portion 102b communicated with each other. The second wiring patterns 103 each comprise a second parallel wiring portion 103a and a second intersecting wiring portion 103b communicated with each other. The third wiring patterns 104 each comprise a third parallel wiring portion 104a and a third intersecting wiring portion 104b communicated with each other. The fourth wiring patterns 105 each comprise a fourth parallel wiring portion 105a and a fourth intersecting wiring portion 105b communicated with each other.

Below are given the itemized descriptions of the structural characteristics of the first-fourth wiring patterns 102-105 based on states viewed from the thickness direction of the insulation substrates 108A and 108B.

The first parallel wiring portions 102a and the fourth parallel wiring portions 105a have the same dimensions and are disposed in parallel with each other.

The second parallel wiring portions 103a and the third parallel wiring portions 104a have the same dimensions and are disposed in parallel with each other.

The first intersecting wiring portions 102b and the fourth intersecting wiring portions 105b intersect with each other.

The second intersecting wiring portions 103b and the third intersecting wiring portions 104b intersect with each other.

The first parallel wiring portions 102a and the third parallel wiring portions 104a are disposed on substantially the same line on the surface 108Aa of the first insulation substrate 108A.

The second parallel wiring portions 103a and the fourth parallel wiring portions 105a are disposed on substantially the same line on the surface 108Ba of the second insulation substrate 108B.

The first intersecting wiring portions 102b and the third intersecting wiring portions 104b are disposed in parallel with each other.

The second intersecting wiring portions 103b and the fourth intersecting wiring portions 105b are disposed in parallel with each other.

Below is given a description, in a manner similar to the foregoing description, based states viewed from the thickness direction of the insulation substrates 108A and 108B.

In each of the first wiring patterns 102 and the second wiring patterns 103 adjacent to each other, an end portion of the first intersecting wiring portion 102b extends to a position where the end portion intersects with an end portion of the second parallel wiring portion 103a, and an end portion of the second intersecting wiring portion 103b extends to a position where the end portion intersects with an end portion of the first parallel wiring portion 102a.

In each of the third wiring patterns 104 and the fourth wiring patterns 105 adjacent to each other, an end portion of the third intersecting wiring portion 104b extends to a position where the end portion intersects with an end portion of the fourth parallel wiring portion 105a, and an end portion of the fourth intersecting wiring portion 105b extends to a position where the end portion intersects with an end portion of the third parallel wiring portion 104a.

Below is given a description, in a manner similar to the foregoing description, based on states viewed from the thickness direction of the insulation substrates 108A and 108B.

The first intersecting wiring portion 102b of each of the first wiring patterns 102 is connected to the second parallel wiring portion 103a of each of the second wiring patterns 103 on one side adjacent to the relevant first wiring pattern 102 with the first electrical connection member 110 interposed therebetween.

The first parallel wiring portion 102a of each of the first wiring patterns 102 is connected to the second intersecting wiring portion 103b of each of the second wiring patterns 103 on the other side adjacent to the relevant first wiring pattern 102 with the first electrical connection member 110 interposed therebetween.

The third intersecting wiring portion 104b of each of the third wiring patterns 104 is connected to the fourth parallel wiring portion 105a of each of the fourth wiring patterns 105 on one side adjacent to the relevant third wiring pattern 104 with the second electrical connection member 111 interposed therebetween.

The third parallel wiring portion 104a of each of the third wiring patterns 104 is connected to the fourth intersecting wiring portion 105b of each of the fourth wiring patterns 105 on the other side adjacent to the relevant third wiring pattern 104 with the second electrical connection member 111 interposed therebetween.

The resist layer 112 is provided between the first insulation substrate 108A and the second insulation substrate 108B, and the first wiring pattern layer 100 and the second wiring pattern layer 101 are electrically insulated from each other by the resist layer 112.

At positions where the first and second electrical connection members 110 and 111 are provided, the resist layer 112 is provided with the resist bore portions 106 penetrating therethrough in a thickness direction thereof. The resist bore portions 106 are thus provided, so that the connection between the first wiring pattern layer 100 and the second wiring pattern 101 by the first and second electrical connection members 110 and 111 is not prevented.

Thus, the first wiring patterns 102 and the second wiring patterns 103 are serially connected to each other with the first electrical connection members 110 interposed therebetween, which constitutes the first wave-shape wiring 113. The third wiring patterns 104 and the fourth wiring patterns 105 are serially connected to each other with the second electrical connection members 111 interposed therebetween, which constitutes the second wave-shape wiring 114.

In the printed wiring board thus constituted, signals in which phases are electrically different to each other through 180 degrees are driven from a signal source 120 for the first wave-shape wiring 113 and the second wave-form wiring 114, which constitutes an electric device having a pseudo twisted pair structure.

As the first electric connection member 110 may be used, other than solder, a thermally-bonding portion between the first wiring pattern 102 and the second wiring pattern 103, a conductive adhesive, or a conductive paste. In a similar manner, as the second electric connection member 111 may be used, other than solder, a conductive adhesive, a conductive paste, or a thermally-bonding portion between the third wiring pattern 104 and the fourth wiring pattern 105.

According to the preferred embodiment 1, the printed wiring board having the pseudo twisted pair structure between the insulation substrates, for which measures for electromagnetic noise protection have been taken, is provided. More specifically, the first wiring patterns 102 and the third wiring patterns 104 to which a signal having a phase electrically different to that of the first wiring patterns 102 through 180 degrees is driven are alternately provided with equal intervals therebetween in a part of the first wiring pattern layer 100 provided on the surface 108Aa of the first insulation substrate 108A. On the other hand, in a part of the second wiring pattern layer 101 provided on the surface 108Ba of the second insulation substrate 108B, the second wiring patterns 103 in which a signal having the same phase as that of the first wiring patterns 102 flows and the fourth wiring patterns 105 in which a signal having the same phase as that of the third wiring patterns 104 flows are provided in a phase order reverse to that of the first and third wiring patterns 102 and 104, and also equally spaced to be thereby arranged in a mirror-image manner (plane-symmetrical) in the case where the first and second insulation substrates 108A and 108B are stacked on each other. Then, the first wiring patterns 102 and the second wiring patterns 103 are serially connected to each other in the resist bore portions 106 with the first electric connection members 110 interposed therebetween, and the third wiring patterns 104 and the fourth wiring patterns 105 are serially connected to each other in the resist bore portions 106 with the second electric connection members 111 interposed therebetween. Accordingly, the first and second wave-shape wirings 113 and 114 having such a pseudo twisted pair structure that the respective wiring patterns three-dimensionally intersect with each other in an orderly manner are formed.

According to the preferred embodiment 1, the first and second wave-shape wirings 113 and 114 in which differential signals flow are provided between the first and second insulation substrates 108A and 108B using the first-fourth wiring patterns 102-105 respectively connected by the first and second electric connection members 110 and 111 such as solder. Therefore, the intervals at which the first and second wave-shape wirings 113 and 114 are provided (formation pitches) are substantially constant. As a result, the pseudo twisted pair structure can be formed without the deterioration of the characteristics of the differential signals, and the generation and influence of the electromagnetic noises can be reduced in comparison to the conventional printed wiring board.

Preferred Embodiment 2

Figure 2A:
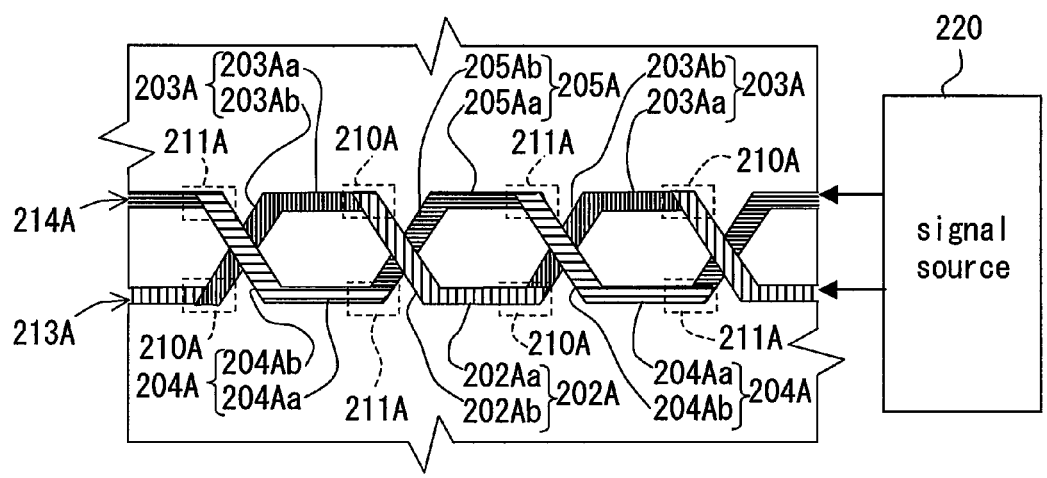
FIG. 2A is one of a group of illustrations of a main section of a printed wiring board according to a preferred embodiment 2 of the present invention and is a perspective view of the main section of the printed wiring board viewed from a surface side thereof.
Figure 2B:
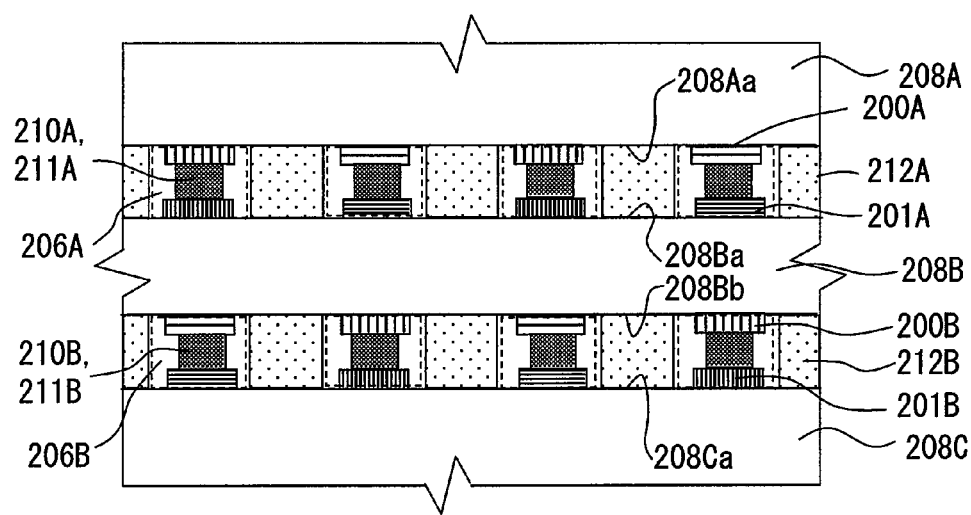
FIG. 2B is one of the group of illustrations of the main section of the printed wiring board according to the preferred embodiment 2 and is a sectional view of the main section of the printed wiring board.
Figure 2C:
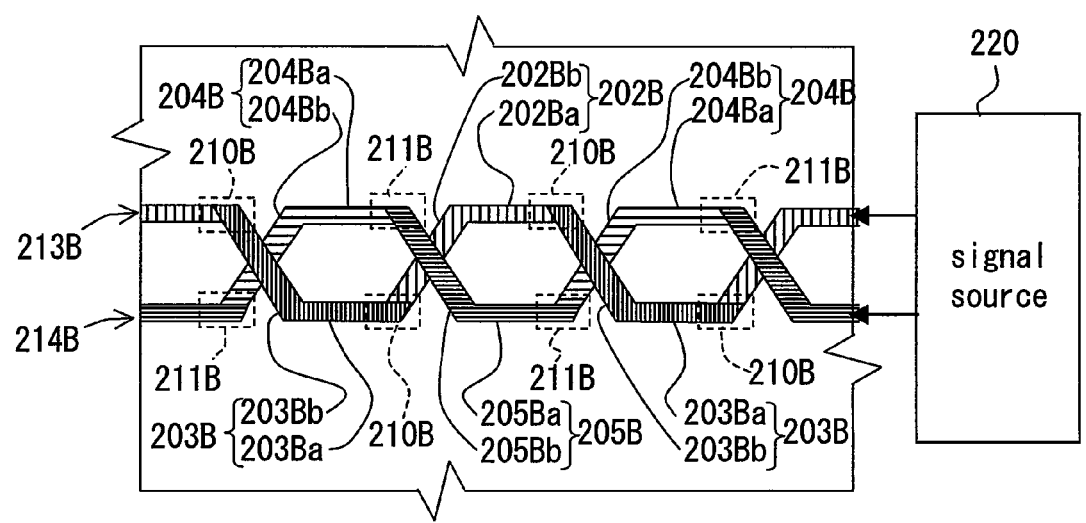
FIG. 2C is one of the group of illustrations of the main section of the printed wiring board according to the preferred embodiment 2 and is a perspective view of the main section of the printed wiring board viewed from a rear-surface side thereof.

FIGS. 2A-2C illustrate a preferred embodiment 2 of the present invention. FIG. 2A is a perspective view of a flexible printed wiring board viewed from an upper-surface side thereof. FIG. 2B is a sectional view of the flexible printed wiring board. FIG. 2C is a perspective view of the flexible printed wiring board viewed from a rear-surface side thereof.

The flexible printed wiring board comprises a first insulation substrate (flexible insulation substrate) 208A, a second insulation substrate (flexible insulation substrate) 208B, a third insulation substrate (flexible insulation substrate) 208C, resist layers 212A and 212B, first wave-shape wirings 213A and 213B, and second wave-shape wirings 214A and 214B. The first insulation substrate 208A and the second insulation substrate 208B are stacked on each other with the resist layer 212A, first wave-shape wiring 213A and second wave-shape wiring 214A interposed therebetween. The first wave-shape wiring 213A and the second wave-shape wiring 214A three-dimensionally intersect with each other between the insulation substrates 208A and 208B in a plane direction and a thickness direction of the substrates. The resist layer 212A is provided between the insulation substrates 208A and 208B (between the first wave-shape wiring 213A and the second wave-shape wiring 214A) and electrically insulate the first wave-shape wiring 213A and the second wave-shape wiring 214A from each other.

The third insulation substrate 208C and the second insulation substrate 208B are stacked on each other with the resist layer 212B, first wave-shape wiring 213B and second wave-shape wiring 214B interposed therebetween. The first wave-shape wiring 213B and the second wave-shape wiring 214B three-dimensionally intersect with each other between the insulation substrates 208C and 208B in the plane direction and the thickness direction of the substrates. The resist layer 212B is provided between the insulation substrates 208C and 208B (between the first wave-shape wiring 213B and the second wave-shape wiring 214B) and electrically insulate the first wave-shape wiring 213B and the second wave-shape wiring 214B from each other.

The first wave-shape wiring 213A comprises first wiring patterns 202A and second wiring patterns 203A. The second wave-shape wiring 214A comprises third wiring patterns 204A and fourth wiring patterns 205A. The first wave-shape wiring 213B comprises first wiring patterns 202B and second wiring patterns 203B. The second wave-shape wiring 214B comprises third wiring patterns 204B and fourth wiring patterns 205B. The first wiring patterns 202A are provided on a surface 208Aa (which is a surface facing the second insulation substrate 208B) of the first insulation substrate 208A. FIG. 2A illustrates two first wiring patterns 202A and 202A having the identical pattern. These first wiring patterns 202A and 202A constitute two intermittent portions in the first wave-shape wiring 213A. The second wiring patterns 203A are provided on a surface 208Ba (which is a surface facing the first insulation substrate 208A) of the second insulation substrate 208B. FIG. 2A illustrates two second wiring patterns 203A and 203A having the identical pattern. These second wiring patterns 203A and 203A constitute two intermittent portions other than those of the first wiring patterns 202A in the first wave-shape wiring 213A.

The first wiring patterns 202B are provided on the other surface 208Bb (which is a surface facing the third insulation substrate 208C) of the second insulation substrate 208B. The number of the first wiring patterns 202B to be provided is at least two, and the plurality of first wiring patterns 202B have the identical pattern. These first wiring patterns 202B, 202B, . . . constitute a plurality of intermittent portions in the first wave-shape wiring 213B. The second wiring patterns 203B are provided on a surface 208Ca (which is a surface facing the second insulation substrate 208B) of the third insulation substrate 208C. The number of the second wiring patterns 203B to be provided is at least two, and the plurality of second wiring patterns 203B have the identical pattern. These second wiring patterns 203B, 203B, . . . constitute a plurality of intermittent portions other than those of the first wiring patterns 202B in the first wave-shape wiring 213B.

The first wiring patterns 202A each comprise a first parallel wiring portion 202Aa and a first intersecting wiring portion 202Ab. The second wiring patterns 203A each comprise a second parallel wiring portion 203Aa and a second intersecting wiring portion 203Ab. The third wiring patterns 204A each comprise a third parallel wiring portion 204Aa and a third intersecting wiring portion 204Ab. The fourth wiring patterns 205A each comprise a fourth parallel wiring portion 205Aa and a fourth intersecting wiring portion 205Ab.

The first wiring patterns 202B each comprise a first parallel wiring portion 202Ba and a first intersecting wiring portion 202Bb. The second wiring patterns 203B each comprise a second parallel wiring portion 203Ba and a second intersecting wiring portion 203Bb. The third wiring patterns 204B each comprise a third parallel wiring portion 204Ba and a third intersecting wiring portion 204Bb. The fourth wiring patterns 205B each comprise a fourth parallel wiring portion 205Ba and a fourth intersecting wiring portion 205Bb.

Below are given the itemized descriptions of the structural characteristics of the first-fourth wiring patterns 202A-205A and 202B-205B based on states viewed from the thickness direction of the insulation substrates 208A-208C.

The first intersecting wiring portion 202Ab of each of the first wiring patterns 202A is connected to the second parallel wiring portion 203Aa of each of the second wiring patterns 203A on one side adjacent to the relevant first wiring pattern 202A with a first electrical connection member 210A interposed therebetween.

The first parallel wiring portion 202Aa of each of the first wiring patterns 202A is connected to the second intersecting wiring portion 203Ab of each of the second wiring patterns 203A on the other side adjacent to the relevant first wiring pattern 202A with the first electrical connection member 210A interposed therebetween.

The third intersecting wiring portion 204Ab of each of the third wiring patterns 204A is connected to the fourth parallel wiring portion 205Aa of each of the fourth wiring patterns 205A on one side adjacent to the relevant third wiring pattern 204A with a second electrical connection member 211A interposed therebetween.

The third parallel wiring portion 204Aa of each of the third wiring patterns 204A is connected to the fourth intersecting wiring portion 205Ab of each of the fourth wiring patterns 205A on the other side adjacent to the relevant third wiring pattern 204A with the second electrical connection member 211A interposed therebetween.

Below is given a description in a manner similar to the foregoing description based on states viewed from the thickness direction of the insulation substrates 208A and 208C.

The first intersecting wiring portion 202Bb of each of the first wiring patterns 202B is connected to the second parallel wiring portion 203Ba of each of the second wiring patterns 203B on one side adjacent to the relevant first wiring pattern 202B with a first electrical connection member 210B interposed therebetween.

The first parallel wiring portion 202Ba of each of the first wiring patterns 202B is connected to the second intersecting wiring portion 203Bb of each of the second wiring patterns 203B on the other side adjacent to the relevant first wiring pattern 202B with the first electrical connection member 210B interposed therebetween.

The third intersecting wiring portion 204Bb of each of the third wiring patterns 204B is connected to the fourth parallel wiring portion 205Ba of each of the fourth wiring patterns 205B on one side adjacent to the relevant third wiring pattern 204B with a second electrical connection member 211B interposed therebetween.

The third parallel wiring portion 204Ba of each of the third wiring patterns 204B is connected to the fourth intersecting wiring portion 205Bb of each of the fourth wiring patterns 205B on the other side adjacent to the relevant third wiring pattern 204B with the second electrical connection member 211B interposed therebetween.

The printed wiring board according to the present preferred embodiment constituted as described so far is further constituted as follows.

The first wiring patterns 202A and the second wiring patterns 203A are serially connected to each other with the first electrical connection members 210A interposed therebetween, which constitutes the first wave-shape wiring 213A.

The third wiring patterns 204A and the fourth wiring patterns 205A are serially connected to each other with the second electrical connection members 211A interposed therebetween, which constitutes the second wave-shape wiring 214A.

The first wiring patterns 202B and the second wiring patterns 203B are serially connected to each other with the first electrical connection members 210B interposed therebetween, which constitutes the first wave-shape wiring 213B.

The third wiring patterns 204B and the fourth wiring patterns 205B are serially connected to each other with the second electrical connection members 211B interposed therebetween, which constitutes the second wave-shape wiring 214B.

The first wiring patterns 202A and the third wiring patterns 204A constitute the first wiring pattern layer 200A on the surface 208Aa of the first insulation substrate 208A.

The second wiring patterns 203A and the fourth wiring patterns 205A constitute the second wiring pattern layer 201A on the one surface 208Ba of the second insulation substrate 208B.

The first wiring patterns 202B and the third wiring patterns 204B constitute the first wiring pattern layer 200B on the other surface 208Bb of the second insulation substrate 208B.

The second wiring patterns 203B and the fourth wiring patterns 205B constitute the second wiring pattern layer 201B on the surface 208Ca of the third insulation substrate 208C.

The resist layer 212A is provided between the first insulation substrate 208A and the second insulation substrate 208B, and the first wiring pattern layer 200A and the second wiring pattern layer 201A are electrically insulated from each other by the resist layer 212A.

At positions where the first and second electrical connection members 210A and 211A are provided, the resist layer 212A is provided with resist bore portions 206A penetrating therethrough in a thickness direction thereof.

The resist layer 212B is provided between the first insulation substrate 208B and the third insulation substrate 208C, and the first wiring pattern layer 200B and the second wiring pattern layer 201B are electrically insulated from each other by the resist layer 212B.

At positions where the first and second electrical connection members 210B and 211B are provided, the resist layer 212B is provided with resist bore portions 206B penetrating therethrough in a thickness direction thereof.

Thus, the first wiring patterns 202A and the second wiring patterns 203A are serially connected to each other with the first electric connection members 210A interposed therebetween, which constitutes the first wave-shape wiring 213A. In a similar manner, the third wiring patterns 204A and the fourth wiring patterns 205A are serially connected to each other with the second electric connection members 211A interposed therebetween, which constitutes the second wave-shape wiring 214A. The first wiring patterns 202B and the second wiring patterns 203B are serially connected to each other with the first electric connection members 210B interposed therebetween, which constitutes the first wave-shape wiring 213B. The third wiring patterns 204B and the fourth wiring patterns 205B are serially connected to each other with the second electric connection members 211B interposed therebetween, which constitutes the second wave-shape wiring 214B.

The structures of the first wave-shape wirings 213A and 213B and the second wave-shape wirings 214A and 214B are basically the same as those of the first wave-shape wiring 113 and the second wave-shape wiring 114 according to the preferred embodiment 1.

In the printed wiring board thus constituted, signals in which phases are electrically different to each other through 180 degrees are driven from a signal source 220 for the first wave-shape wiring 213A and the second wave-form wiring 214A, which constitutes a first pseudo twisted pair structure. Further, signals in which phases are electrically different to each other through 180 degrees are driven from the signal source 220 for the first wave-shape wiring 213B and the second wave-form wiring 214B, which constitutes a second pseudo twisted pair structure. Further, the first pseudo twisted pair structure and the second pseudo twisted pair structure are disposed with the second insulation substrate 208B interposed therebetween in a plane-symmetrical manner (mirror-image relationship) relative to the planes thereof (surface where the substrates are joined with each other).

According to the preferred embodiment 2, the pseudo twisted pairs in which polarities of the electromagnetic noises radiation are different (directions to which electromagnetic noises are radiated are different) are provided continuously (stacked on each other) in the thickness direction of the printed wiring board. As a result, the radiated noises in the thickness direction of the wiring board can be further reduced in comparison to the printed wiring board according to the preferred embodiment 1.

Preferred Embodiment 3

Figure 3A:
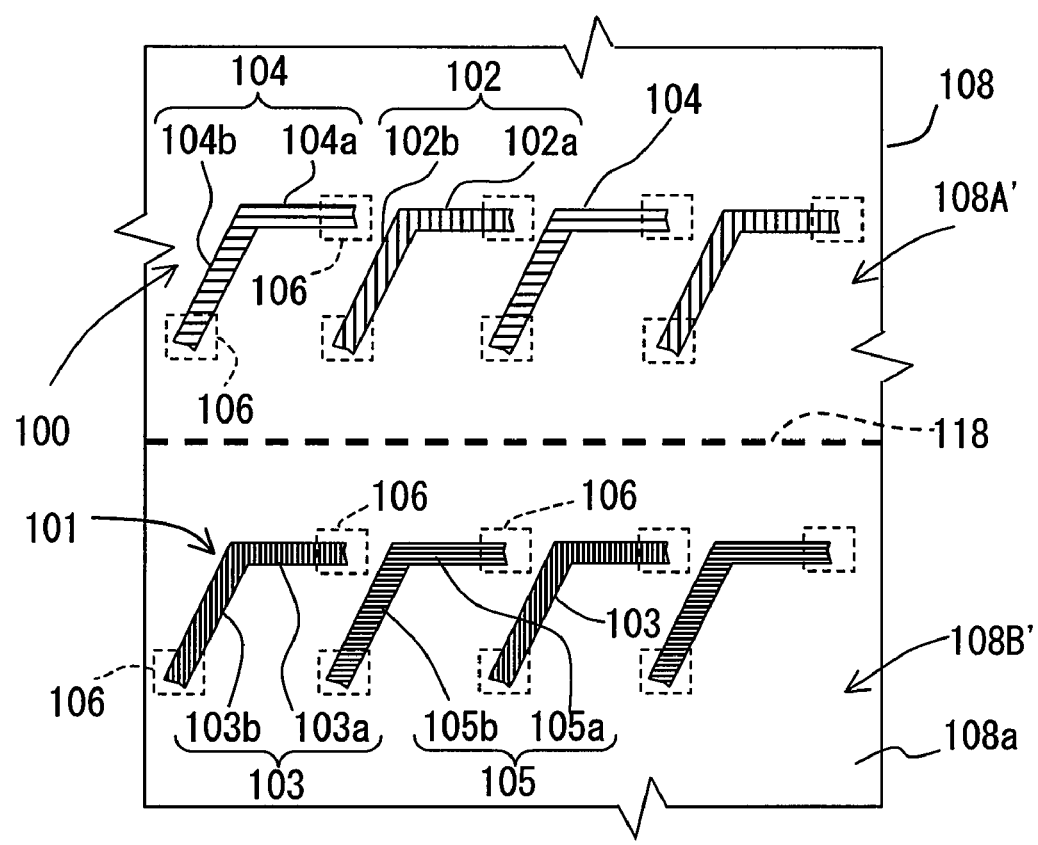
FIG. 3A is one of a group of illustrations of a main section of a flexible printed wiring board according to a preferred embodiment 3 of the present invention and is a plan view of the flexible printed wiring board before it is bent.
Figure 3B:
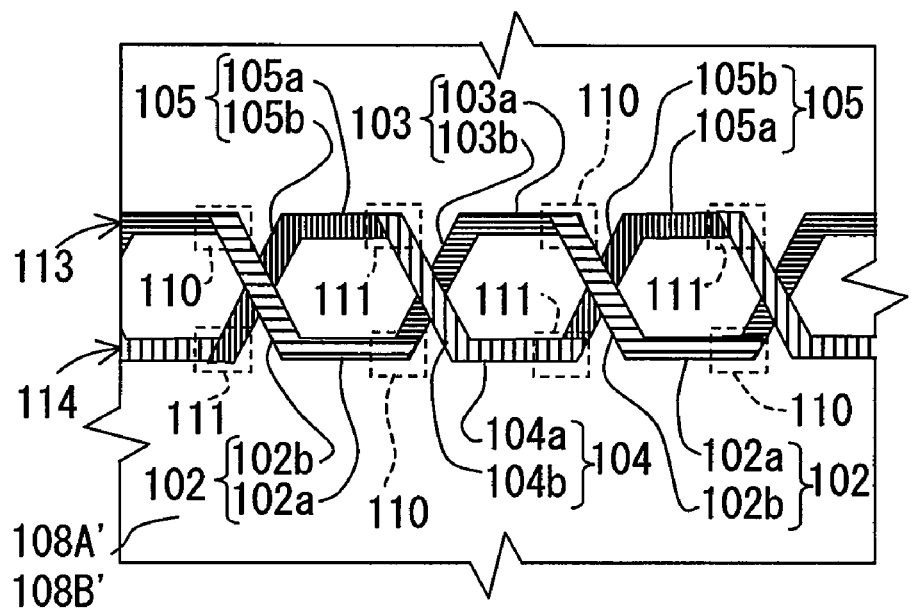
FIG. 3B is one of the group of illustrations of the main section of the flexible printed wiring board according to the preferred embodiment 3 and is a perspective view of the flexible printed wiring board after it is bent.
Figure 3C:
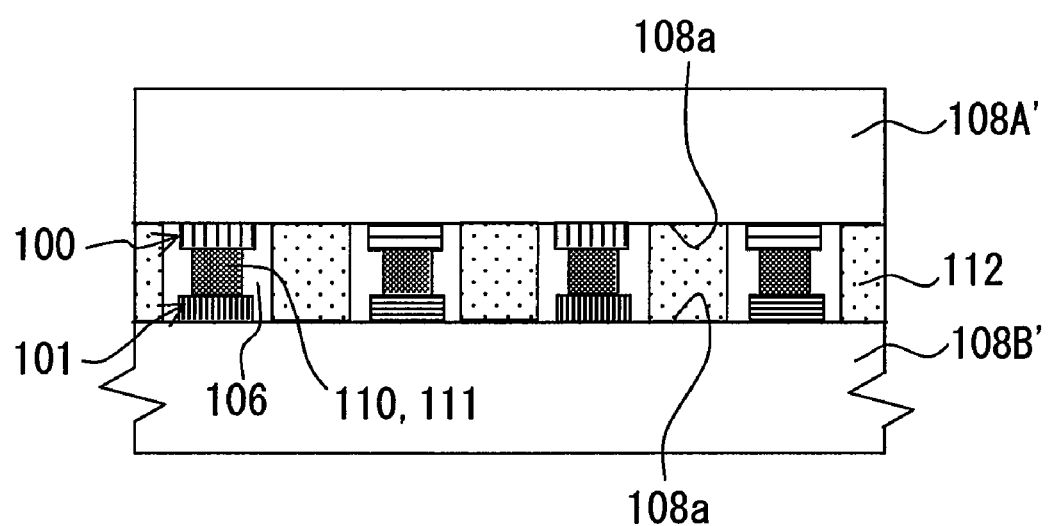
FIG. 3C is one of the group of illustrations of the main section of the flexible printed wiring board according to the preferred embodiment 3 and is a sectional view of the flexible printed wiring board after it is bent.

A preferred embodiment 3 of the present invention relates to a method of manufacturing the printed wiring board according to the preferred embodiment 1, FIG. 3A is a plan view of the flexible printed wiring board before it is bent. FIG. 3B is a perspective view of the flexible printed wiring board after it is bent. FIG. 3C is a sectional view of the flexible printed wiring board after it is bent. The respective components provided in the present preferred embodiment are basically the same as those according to the preferred embodiment 1 (FIG. 1). The same components are provided with the same reference symbols, and their structures will not be described in this section since the preferred embodiment 1 can be referenced for further details of the structures.

First Step

First, first and second insulation substrates are prepared. In the present preferred embodiment, a flexible insulation substrate 108 which is bendable along a bending line 118 is prepared as the first and second insulation substrates. The flexible insulation substrate 108 comprises a first substrate region 108A' and a second substrate region 108B' divided by the bending line 118, and the substrate regions 108A' and 108B' are coupled with each other at one of the ends thereof (bending line 118) and constitute the flexible insulation substrate 108. The first substrate region 108A' and the second substrate region 108B' are flexibly deformable and respectively constitute the first and second insulation substrates coupled with each other when they are bent along the bending line 118.

In the case where the number of the substrates regions 108A' and 108b' to be provided is at least three, coupling sections therebetween are provided alternately at either of both ends thereof so that these plurality of substrate regions are formed into a bent sheet shape (in brief, one flexible insulation substrate 108).

A first wiring pattern layer 100 comprising a group of first wiring patterns 102 and a group of third wiring patterns 104 is formed on one-side surface 108a in the first substrate region 108A' of the flexible insulation substrate 108. A second wiring pattern layer 101 comprising a group of second wiring patterns 103 and a group of fourth wiring patterns 105 is formed on the one-side surface 108a in the second substrate region 108B' of the flexible insulation substrate 108.

The first and second wiring pattern layers 100 and 110 are formed at the following positions. The flexible insulation substrate 108 is valley-folded along the bending line 118 with the one-side surface 108a being directed inward. Then, the first and second wiring pattern layers 100 and 110 (first-fourth wiring patterns 102-105) are formed at such positions that the following states are generated when the first substrate region 108A' and the second substrate region 108B' are stacked on each other. Descriptions are made hereinafter based on states viewed from the thickness direction of the flexible insulation substrate 108.

In the first wiring pattern layer 100, the first wiring patterns 102 and the third wiring patterns 104 are alternately provided along a line in parallel with the bending line 118.

In the second wiring pattern layer 101, the second wiring patterns 103 and the fourth wiring patterns 105 are alternately provided along a line in parallel with the bending line 118.

Before the bending, the first wiring pattern layer 100 and the second wiring pattern layer 101 are provided at such positions that they are line-symmetrical to each other relative to the bending line 118.

Before the bending, each of the first wiring patterns 102 and each of the fourth wiring patterns 105 are provided at such positions that they are line-symmetrical to each other relative to the bending line 118.

Before the bending, each of the second wiring patterns 103 and each of the third wiring patterns 104 are provided at such positions that they are line-symmetrical to each other relative to the bending line 118.

In the first wiring patterns 102 and the fourth wiring patterns 105 at such positions that they are line-symmetrical to each other relative to the bending line 118 before the bending, the first parallel wiring portions 102a and the fourth parallel wiring portions 105a have the same dimensions, while they are disposed in parallel with each other after the bending.

In the second wiring patterns 103 and the third wiring patterns 104 at such positions that they are line-symmetrical to each other relative to the bending line 118 before the bending, the second parallel wiring portions 103a and the third parallel wiring portions 104a have the same dimensions, while they are disposed in parallel with each other after the bending.

In the first wiring patterns 102 and the fourth wiring patterns 105 at such positions that they are line-symmetrical to each other relative to the bending line 118, the first intersecting wiring portions 102b and the fourth intersecting wiring portions 105b intersect with each other after the bending.

In the second wiring patterns 103 and the third wiring patterns 104 at such positions that they are line-symmetrical to each other relative to the bending line 118, the second intersecting wiring portions 103b and the third intersecting wiring portions 104b intersect with each other after the bending.

All of the first parallel wiring portions 102a and the third parallel wiring portions 104a constituting the group of first wiring patterns 102 and the group of third wiring patterns 104 are disposed on substantially the same line despite the bending.

All of the second parallel wiring portions 103a and the fourth parallel wiring portions 105a constituting the group of second wiring patterns 103 and the group of fourth wiring patterns 105 have the same dimensions and are disposed on substantially the same line despite the bending.

All of the first intersecting wiring portions 102b and the third intersecting wiring portions 104b constituting the group of first wiring patterns 102 and the group of third wiring patterns 104 have the same dimensions and are disposed in parallel with each other despite the bending.

All of the second intersecting wiring portions 103b and the fourth intersecting wiring portions 105b constituting the group of second patterns 103 and the group of fourth wiring patterns 105 have the same dimensions and are disposed in parallel with each other despite the bending.

In the first wiring patterns 102 and the second wiring patterns 103 adjacent to the first wiring patterns 102 on one side thereof along the bending line 118 after the bending, edges of the first parallel wiring portions 102a and edges of the second intersecting wiring portions 103b overlap with each other after the bending.

In the first wiring patterns 102 and the second wiring patterns 103 adjacent to the wiring patterns 102 on the other side thereof along the bending line 118 after the bending, edges of the first intersecting wiring portions 102b and edges of the second parallel wiring portions 103a overlap with each other after the bending.

In the third wiring patterns 104 and the fourth wiring patterns 105 adjacent to the third wiring patterns 104 on one side thereof along the bending line 118 after the bending, edges of the third parallel wiring portions 104a and edges of the fourth intersecting wiring portions 105b overlap with each other after the bending.

In the third wiring patterns 104 and the fourth wiring patterns 105 adjacent to the third wiring patterns 104 on the other side thereof along the bending line 118 after the bending, edges of the third intersecting wiring portions 104b and edges of the fourth parallel wiring portions 105a overlap with each other after the bending.

After the first and second wiring pattern layers 100 and 101 are thus formed, a resist layer 112 having an electric insulation property is formed on the one-side surface 108a of the flexible insulation substrate 108 so that the first and second wiring pattern layers 100 and 101 are covered with the resist layer 112. Further, resist bore portions 106 are formed in the resist layer 112. The resist bore portion 106 is formed by means of, for example, the photolithography. The resist bore portions 106 are formed selectively at both ends of the first-fourth wiring patterns 102-105 (edges of the first-fourth parallel wiring portions 102a-105a and edges of the first-fourth wiring portions 102b-105b). The both edges of the first-wiring patterns 102-105 are exposed due to the resist bore portions 106.

At both edges of the first-fourth wiring patterns 102-105 exposed at the bottoms of the resist bore portions 106 (edges of the first-fourth parallel wiring portions 102a-105a, and edges of the first-fourth intersecting wiring portions 102b-105b), first and second electric connection members 110 and 111 are formed. A conductive adhesive or solder constitutes the first and second electric connection members 110 and 111. The first and second electric connection members 110 and 111 are formed by means of, for example, a thick-film printing process. The first electric connection member 110 is formed at both ends of the first and second wiring patterns 102 and 103. The second electric connection member 111 is formed at both ends of the third and fourth wiring patterns 104 and 105.

Second Step

After the implementation of the First Step, the flexible insulation substrate 108 is valley-folded along the bending line 118 with the one-side surface 108a directed inward. Accordingly, the edges of the first intersecting wiring portions 102b of the first wiring patterns 102 overlap with the edges of the second parallel wiring portions 103a of the second wiring patterns 103 adjacent to the first wiring patterns 102 on one side thereof along the bending line 118.

In a similar manner, the edges of the first parallel wiring portions 102a of the first wiring patterns 102 overlap with the edges of the second intersecting wiring portions 103b of the second wiring patterns 103 adjacent to the first wiring patterns 102 on the other side thereof along the bending line 118. In a similar manner, the edges of the third intersecting wiring portions 104b of the third wiring patterns 104 overlap with the edges of the fourth parallel wiring portions 105a of the fourth wiring patterns 105 adjacent to the third wiring patterns 104 on one side thereof along the bending line 118. In a similar manner, the edges of the third parallel wiring portions 104a of the third wiring patterns 104 overlap with the edges of the fourth intersecting wiring portions 105b of the fourth wiring patterns 105 adjacent to the third wiring patterns 104 on the other side thereof along the bending line 118.

In this state, the edges of the first intersecting wiring portions 102b and the edges of the second parallel wiring portions 103a are connected to each other with the first electric connection members 110 interposed therebetween. In a similar manner, the edges of the first parallel wiring portions 102a and the edges of the second intersecting wiring portions 103b are connected to each other with the first electric connection members 110 interposed therebetween.

In a similar manner, the edges of the third intersecting wiring portions 104b and the edges of the fourth parallel wiring portions 105a are connected to each other with the second electric connection members 111 interposed therebetween. In a similar manner, the edges of the third parallel wiring portions 104a and the edges of the fourth intersecting wiring portions 105b are connected to each other with the second electric connection members 111 interposed therebetween. Accordingly, the group of first wiring patterns 102 and the group of second wiring patterns 103 are serially connected to each other with the first electric connection members 110 interposed therebetween, which constitutes the first wave-shape wiring 113. In a similar manner, the group of third wiring patterns 104 and the group of fourth wiring patterns 105 are serially connected to each other with the second electric connection members 111 interposed therebetween, which constitutes the second wave-shape wiring 114.

The first wave-shape wiring 113 and the second wave-shape wiring 114 thus constituted are formed between the first substrate region 108A' and the second substrate region 108B' in such a way that they three-dimensionally interest with each other in the plane direction and the thickness direction of the flexible insulation substrate 108.

A thermally-bonding section between the first wiring pattern 102 and the second wiring pattern 103 or a thermally-bonding section between the third wiring pattern 104 and the fourth wiring pattern 105 may constitute the first and second electric connection members 110 and 111. In such a case, it is unnecessary to separately provide the first and second electric connection members 110 and 111 made up of the conductive adhesive or solder.

According to the preferred embodiment 3, wherein the flexible insulation substrate 108 is bent, so that the printed wiring board provided with the pseudo twisted pair structure is formed, the flexible printed wiring board according to the preferred embodiment 1 capable of reducing the generation and influence of the electromagnetic noises in comparison to the conventional flexible printed wiring board can be manufactured without any increase in costs and in a most simplified manufacturing process. Further, when the first-fourth wiring patterns 102-105 are connected by the first and second electric connection members 110 and 111, the distance between the two wave-shape wirings 113 and 114 in which the differential signals flow can be substantially constant. As a result, the pseudo twisted pair structure can be formed without the deterioration of the characteristics of the differential signals.

Preferred Embodiment 4

Figure 4A:
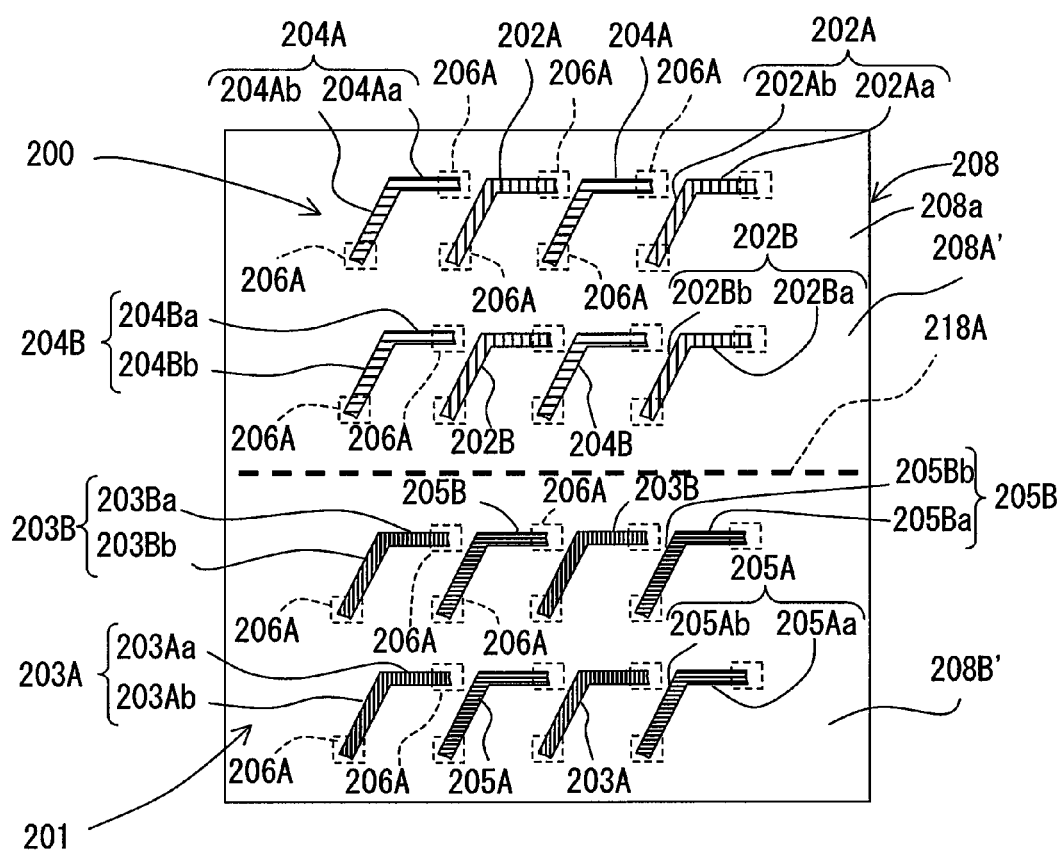
FIG. 4A is one of a first group of illustrations of a main section of a flexible printed wiring board according to a preferred embodiment 4 of the present invention and is a plan view of the flexible printed wiring board before it is bent.
Figure 4B:
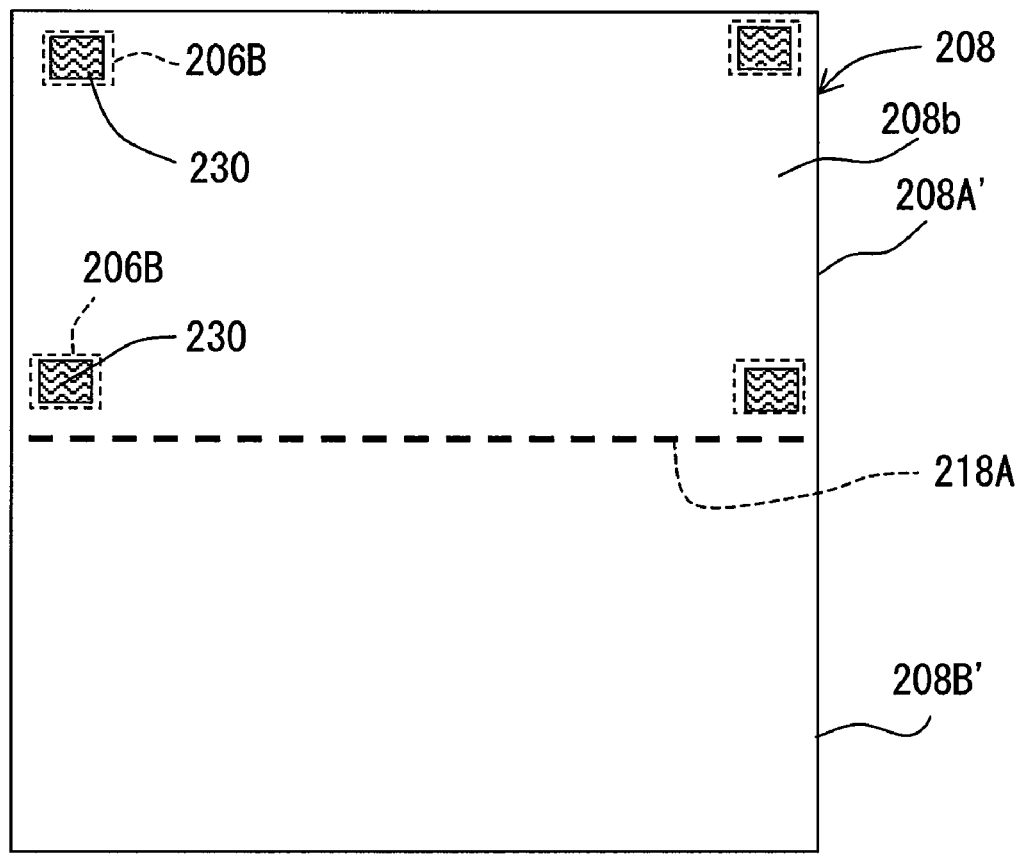
FIG. 4B is one of the first group of illustrations of the main section of the flexible printed wiring board according to the preferred embodiment 4 and is a rear-surface view of the flexible printed wiring board before it is bent.
Figure 5A:
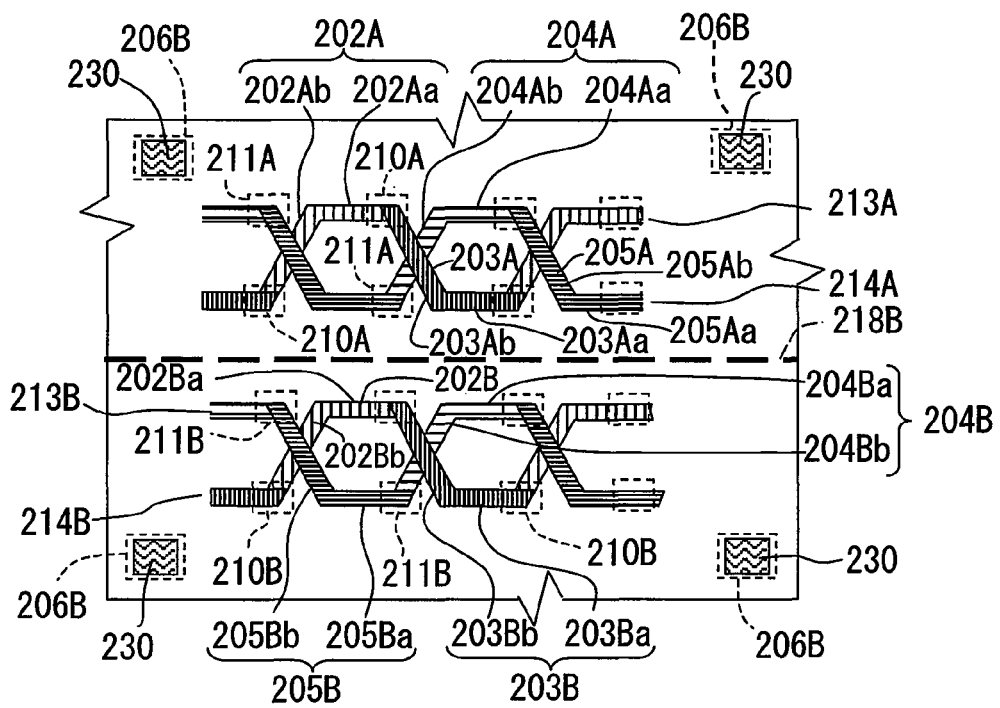
FIG. 5A is one of a second group of illustrations of the main section of the flexible printed wiring board according to the preferred embodiment 4 and is a perspective view of the flexible printed wiring board which was bent once.
Figure 5B:
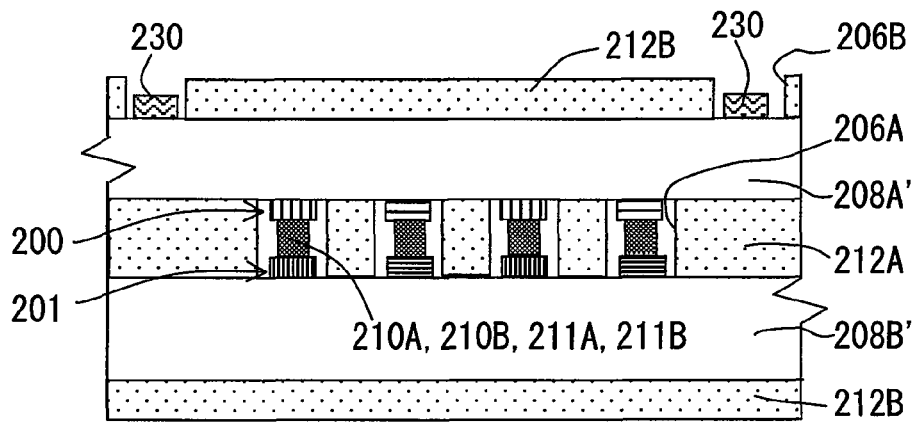
FIG. 5B is one of the second group of illustrations of the main section of the flexible printed wiring board according to the preferred embodiment 4 and is a sectional view of the flexible printed wiring board which was bent once.
Figure 5C:
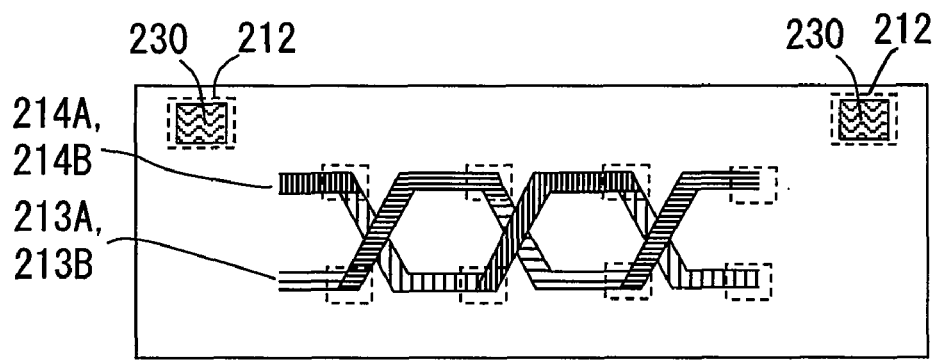
FIG. 5C is one of the second group of illustrations of the main section of the flexible printed wiring board according to the preferred embodiment 4 and is a perspective view of the flexible printed wiring board which was bent twice.
Figure 5D:
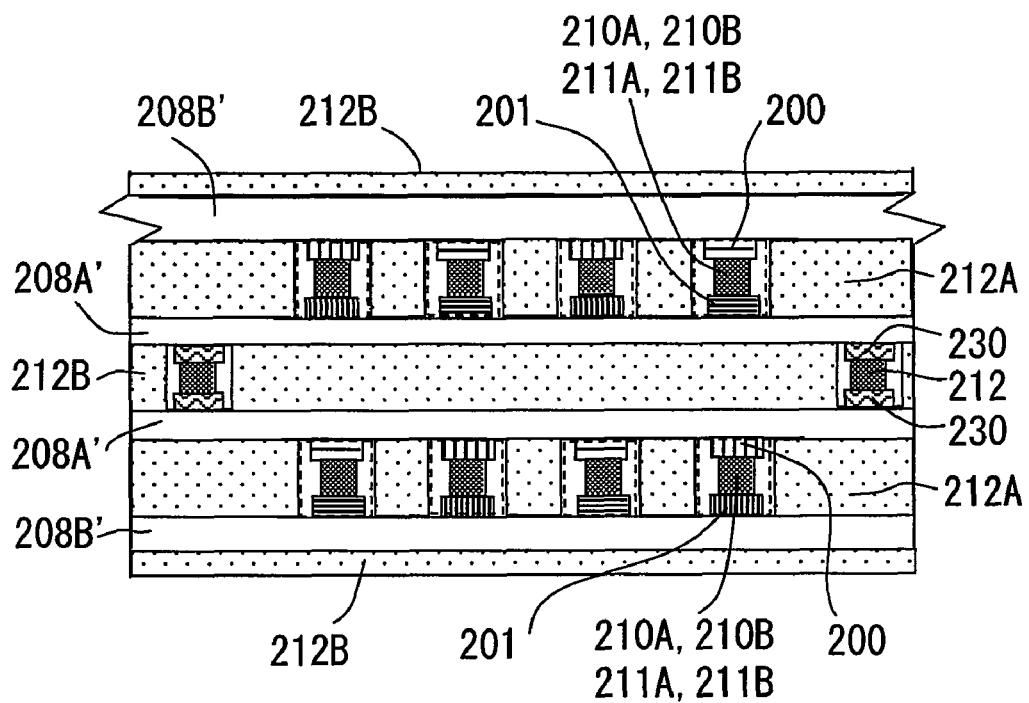
FIG. 5D is one of the second group of illustrations of the main section of the flexible printed wiring board according to the preferred embodiment 4 and is a sectional view of the flexible printed wiring board which was bent twice.
Figure 6:
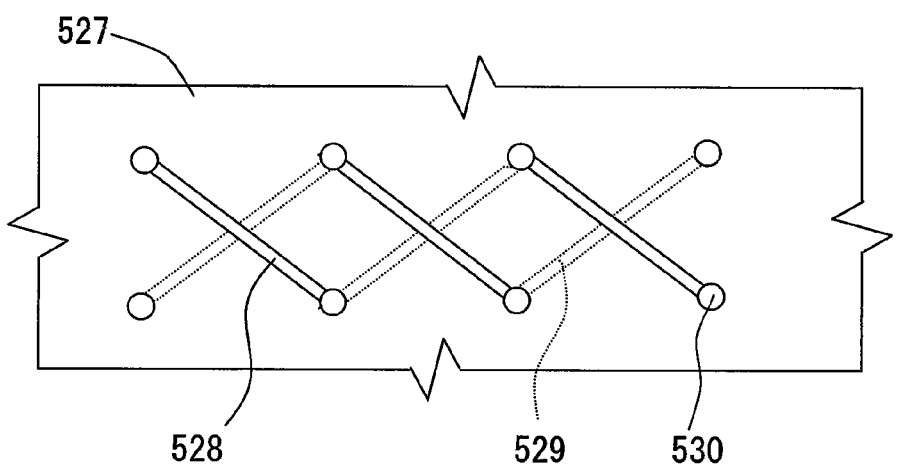
FIG. 6 is a plan view of a conventional printed wiring board having a twisted pair structure.
Figure 7A:
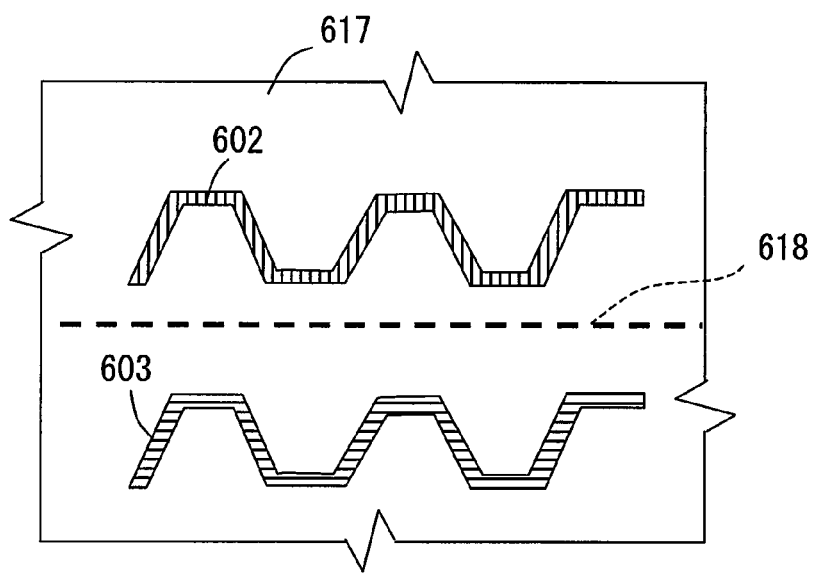
FIG. 7A is a plan view of a conventional flexible printed wiring board having a twisted pair structure.
Figure 7B:
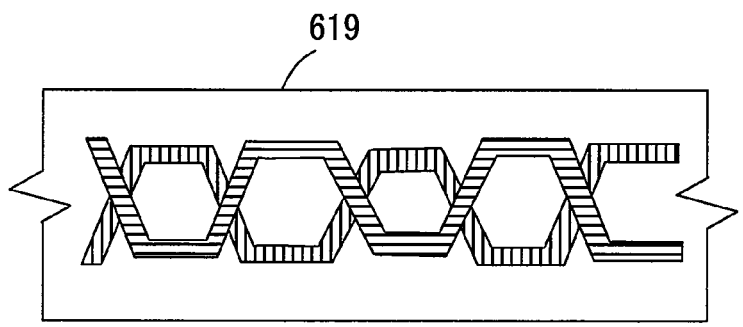
FIG. 7B is a perspective view of the conventional flexible printed wiring board having the twisted pair structure.

A preferred embodiment 4 of the present invention provides a method of manufacturing a printed wiring board having the same structure as that of the preferred embodiment 2 using the flexible insulation substrate. FIG. 4A is a plan view of the flexible printed wiring board before it is bent. FIG. 4B is a rear-surface view of the flexible printed wiring board before it is bent. FIG. 5A is a perspective view of the flexible printed wiring board which was bent once. FIG. 5B is a sectional view of the flexible printed wiring board which was bent once. FIG. 5C is a perspective view of the flexible printed wiring board which was bent twice. FIG. 5D is a sectional view of the flexible printed wiring board which was bent twice.

The respective components provided in the flexible printed wiring board according to the present preferred embodiment are basically the same as those according to the preferred embodiment 2 (FIG. 2), and the same components are provided with the same reference symbols. Detailed description is omitted in this section since the preferred embodiment 2 can be referenced for details of the structures.

First Step

First, first and second insulation substrates are prepared. In the present preferred embodiment, a flexible insulation substrate 208 which is bendable along a first bending line 218A is prepared as the first and second insulation substrates. The flexible insulation substrate 208 comprises a first substrate region 208A' and a second substrate region 208B' divided by the first bending line 218A, and the substrate regions 208A' and 208B' are coupled with each other at one of the ends thereof (first bending line 218A), which constitutes the flexible insulation substrate 208. The first substrate region 208A' and the second substrate region 208B' respectively constitute the first and second insulation substrates coupled with each other when they are bent along the first bending line 218A.

A first wiring pattern layer 200 is formed on the one-side surface 208a in the first substrate region 208A' of the flexible insulation substrate 208. The first pattern layer 200 comprises a group of first wiring patterns 202A, a group of first wiring patterns 202B, a group of third wiring patterns 204A and a group of third wiring patterns 204B. A second pattern layer 201 is formed on the one-side surface 208a in the second substrate region 208B' of the flexible insulation substrate 208. The second wiring pattern layer 201 comprises a group of second wiring patterns 203A, a group of second wiring patterns 203B, a group of fourth wiring patterns 205A and a group of fourth wiring patterns 205B. Auxiliary wirings 230 are formed on the other-side surface 208b in the first substrate region 208A' of the flexible insulation substrate 208. The auxiliary wirings 230 are formed at four corners of the first substrate region 208A' on the other-side surface 208b.

The first and second wiring pattern layers 200 and 201 are formed at the following positions. The flexible insulation substrate 108 is valley-folded along the first bending line 218A with the one-side surface 208a directed inward. Then, the first and second wiring pattern layers 200 and 201 (first to fourth wiring patterns 202A-205A, and 202B-205B) are formed at such positions where the following states are generated when the first substrate region 208A' and the second substrate region 208b' are stacked on each other. Descriptions are made based on states viewed from the thickness direction of the flexible insulation substrate 208.

In the first wiring pattern layer 200, the first wiring patterns 202A and the third wiring patterns 204A are alternately provided along a line in parallel with the first bending line 218.

In the first wiring pattern layer 200, the first wiring patterns 202B and the third wiring patterns 204B are alternately provided along a line in parallel with the first bending line 218.

Before the bending, the first and third wiring patterns 202A and 204A are provided at positions more distant than the positions for the first and third wiring patterns 202B and 204B relative to the first bending line 218.

In the second wiring pattern layer 201, the second wiring patterns 203A and the fourth wiring patterns 205A are alternately provided along a line in parallel with the first bending line 218.

In the second wiring pattern layer 201, the second wiring patterns 203B and the fourth wiring patterns 205B are alternately provided along a line in parallel with the first bending line 218.

Before the bending, the second and fourth wiring patterns 203A and 205A are provided at positions more distant than the positions for the second and fourth wiring patterns 203B and 205B relative to the first bending line 218A.

Before the bending, the first wiring pattern layer 200 and the second wiring pattern layer 201 are provided at such positions that they are line-symmetrical to each other relative to the first bending line 218A.

Before the bending, each of the first wiring patterns 202A and each of the fourth wiring patterns 205A are provided at such positions that they are line-symmetrical to each other relative to the first bending line 218A.

Before the bending, each of the first wiring patterns 202B and each of the fourth wiring patterns 205B are provided at such positions that they are line-symmetrical to each other relative to the first bending line 218A.

Before the bending, each of the second wiring patterns 203A and each of the third wiring patterns 204A are provided at such positions that they are line-symmetrical to each other relative to the first bending line 218A.

Before the bending, each of the second wiring patterns 203B and each of the third wiring patterns 204B are provided at such positions that they are line-symmetrical to each other relative to the first bending line 218A.

In the first wiring patterns 202A and the fourth wiring patterns 205A provided at such positions that they are line-symmetrical to each other relative to the first bending line 218A before the bending, the first parallel wiring portions 202Aa and the fourth parallel wiring portions 205Aa have the same dimensions, while they are disposed in parallel with each other after the bending.

In the first wiring patterns 202B and the fourth wiring patterns 205B provided at such positions that they are line-symmetrical to each other relative to the first bending line 218A before the bending, the first parallel wiring portions 202Ba and the fourth parallel wiring portions 205Ba have the same dimensions, while they are disposed in parallel with each other after the bending.

In the second wiring patterns 203A and the third wiring patterns 204A provided at such positions that they are line-symmetrical to each other relative to the first bending line 218A before the bending, the second parallel wiring portions 203Aa and the third parallel wiring portions 204Aa have the same dimensions, while they are disposed in parallel with each other after the bending.

In the second wiring patterns 203B and the third wiring patterns 204B provided at such positions that they are line-symmetrical to each other relative to the first bending line 218A before the bending, the second parallel wiring portions 203Ba and the third parallel wiring portions 204Ba have the same dimensions, while they are disposed in parallel with each other after the bending.

In the first wiring patterns 202A and the fourth wiring patterns 205A provided at such positions that they are line-symmetrical to each other relative to the first bending line 218A before the bending, the first intersecting wiring portions 202Ab and the fourth intersecting wiring portions 205Ab have the same dimensions, while they intersect with each other after the bending.

In the first wiring patterns 202B and the fourth wiring patterns 205B provided at such positions that they are line-symmetrical to each other relative to the first bending line 218A before the bending, the first intersecting wiring portions 202Bb and the fourth intersecting wiring portions 205Bb intersect with each other after the bending.

In the second wiring patterns 203A and the third wiring patterns 204A provided at such positions that they are line-symmetrical to each other relative to the first bending line 218A before the bending, the second intersecting wiring portions 203Ab and the third intersecting wiring portions 204Ab intersect with each other after the bending.

In the second wiring patterns 203B and the third wiring patterns 204B provided at such positions that they are line-symmetrical to each other relative to the first bending line 218A before the bending, the second intersecting wiring portions 203Bb and the third intersecting wiring portions 204Bb intersect with each other after the bending.

All of the first parallel wiring portions 202Aa and the third parallel wiring portions 204Aa constituting the group of first wiring patterns 202A and the group of third wiring patterns 204A are on substantially the same line despite the bending.

All of the first parallel wiring portions 202Ba and the third parallel wiring portions 204Ba constituting the group of first wiring patterns 202B and the group of third wiring patterns 204B are on substantially the same line despite the bending.

All of the second parallel wiring portions 203Aa and the fourth parallel wiring portions 205Aa constituting the group of second wiring patterns 203A and the group of fourth wiring patterns 205A are on substantially the same line despite the bending.

All of the second parallel wiring portions 203Ba and the fourth parallel wiring portions 205Ba constituting the group of second wiring patterns 203B and the group of fourth wiring patterns 205B are on substantially the same line despite the bending.

All of the first intersecting wiring portions 202Ab and the third intersecting wiring portions 204Ab constituting the group of first wiring patterns 202A and the group of third wiring patterns 204A have the same dimensions and are disposed in parallel with each other despite the bending.

All of the second intersecting wiring portions 203Ab and the fourth intersecting wiring portions 205Ab constituting the group of second wiring patterns 203A and the group of fourth wiring patterns 205A have the same dimensions and are disposed in parallel with each other despite the bending.

All of the second intersecting wiring portions 203Bb and the fourth intersecting wiring portions 205Bb constituting the group of second wiring patterns 203B and the group of fourth wiring patterns 205B have the same dimensions and are disposed in parallel with each other despite the bending.

In the first wiring patterns 202A and the second wiring patterns 203A adjacent to the first wiring patterns 202A on one side thereof along the first bending line 218A after the bending, edges of the first parallel wiring portions 202Aa and edges of the second intersecting wiring portions 203Ab overlap with each other after the bending.

In the first wiring patterns 202B and the second wiring patterns 203B adjacent to the first wiring patterns 202B on one side thereof along the first bending line 218A after the bending, edges of the first parallel wiring portions 202Ba and edges of the second intersecting wiring portions 203Bb overlap with each other after the bending.

In the first wiring patterns 202A and the second wiring patterns 203A adjacent to the first wiring patterns 202A on the other side thereof along the first bending line 218A after the bending, edges of the first intersecting wiring portions 202Ab and edges of the second parallel wiring portions 203Aa overlap with each other after the bending.

In the first wiring patterns 202B and the second wiring patterns 203B adjacent to the first wiring patterns 202B on the other side thereof along the first bending line 218A after the bending, edges of the first intersecting wiring portions 202Bb and edges of the second parallel wiring portions 203Ba overlap with each other after the bending.

In the third wiring patterns 204A and the fourth wiring patterns 205A adjacent to the third wiring patterns 204A on one side thereof along the first bending line 218A after the bending, edges of the third parallel wiring portions 204Aa and edges of the fourth intersecting wiring portions 205Ab overlap with each other after the bending.

In the third wiring patterns 204B and the fourth wiring patterns 205B adjacent to the third wiring patterns 204B on one side thereof along the first bending line 218A after the bending, edges of the third parallel wiring portions 204Ba and edges of the fourth intersecting wiring portions 205Bb overlap with each other after the bending.

In the third wiring patterns 204A and the fourth wiring patterns 205A adjacent to the third wiring patterns 204A on the other side thereof along the first bending line 218A after the bending, edges of the third intersecting wiring portions 204Ab and edges of the fourth parallel wiring portions 205Aa overlap with each other after the bending.

In the third wiring patterns 204B and the fourth wiring patterns 205B adjacent to the third wiring patterns 204B on the other side thereof along the first bending line 218A after the bending, edges of the third intersecting wiring portions 204Bb and edges of the fourth parallel wiring portions 205Ba overlap with each other after the bending.

After the first and second wiring pattern layers 200 and 201 and the auxiliary wirings 230 are thus formed, resist layers 212A and 212B having an electric insulation property are formed on both the surfaces 208a and 208b of the flexible insulation substrate 208 so that the first and second wiring pattern layers 200 and 201 and the auxiliary wirings 230 are covered with the resist layers 212A and 212B. Further, resist bore portions 206A and 206B are formed in the resist layers 212A and 212B.

The resist bore portions 206A and 206B are formed selectively at both ends of the first-fourth wiring patterns 202A-205A and 202B-205B (edges of the first-fourth parallel wiring portions 202Aa-205Aa and 202Ba-205Ba, and edges of the first-fourth intersecting wiring portions 202Ab-205Ab and 202Bb-205Bb), and the auxiliary wirings 230. The edges of the first-fourth wiring patterns 202A-205A and 202B-205B and the auxiliary wirings 230 are exposed due to the resist bore portions 206A and 206B.

Further, first-third electric connection members 210A, 210B, 211A, 211B and 212 are formed at the edges of the first-fourth wiring patterns 202A-205A and 202B-205B exposed at the bottoms of the resist bore portions 206A and 206B (edges of the first-fourth parallel wiring portions 202Aa-205Aa and 202Ba-205Ba, and edges of the first-fourth intersecting wiring portions 202Ab-205Ab and 202Bb-205Bb) and the auxiliary wirings 230. The first-third electric connection members 210A, 210B, 211A, 211B and 212 are made up of solder or a conductive adhesive. The first electric connection member 210A is formed at both the edges of the first and second wiring patterns 202A and 203A. The first electric connection member 210B is formed at both the edges of the first and second wiring patterns 202B and 203B. The second electric connection member 211A is formed at both the edges of the third and fourth wiring patterns 204A and 205A. The second electric connection member 211B is formed at both the edges of the third and fourth wiring patterns 204B and 205B. The third electric connection member 212 is formed on the auxiliary wirings 230.

Second Step

After the implementation of the First Step, the flexible insulation substrate 208 is valley-folded along the first bending line 218A with the one-side surface 108a directed inward. Accordingly, the edges of the first intersecting wiring portions 202Ab of the first wiring patterns 202A overlap with the edges of the second parallel wiring portions 203Aa of the second wiring patterns 203A adjacent to the first wiring patterns 202A on one side thereof along the first bending line 218A. In a similar manner, the edges of the first parallel wiring portions 202Aa of the first wiring patterns 202A overlap with the edges of the second intersecting wiring portions 203Ab of the second wiring patterns 203A adjacent to the first wiring patterns 202A on the other side thereof along the first bending line 218A.

In a similar manner, the edges of the first intersecting wiring portions 202Bb of the first wiring patterns 202B overlap with the edges of the second parallel wiring portions 203Ba of the second wiring patterns 203B adjacent to the first wiring patterns 202B on one side thereof along the first bending line 218A. In a similar manner, the edges of the first parallel wiring portions 202Ba of the first wiring patterns 202B overlap with the edges of the second intersecting wiring portions 203Bb of the second wiring patterns 203B adjacent to the first wiring patterns 202B on the other side thereof along the first bending line 218A.

In a similar manner, the edges of the third intersecting wiring portions 204Ab of the third wiring patterns 204A overlap with the edges of the fourth parallel wiring portions 205Aa of the fourth wiring patterns 205A adjacent to the third wiring patterns 204A on one side thereof along the first bending line 218A. In a similar manner, the edges of the third parallel wiring portions 204Aa of the third wiring patterns 204A overlap with the edges of the fourth intersecting wiring portions 205Ab of the fourth wiring patterns 205A adjacent to the third wiring patterns 204A on the other side thereof along the first bending line 218A.

In a similar manner, the edges of the third intersecting wiring portions 204Bb of the third wiring patterns 204B overlap with the edges of the fourth parallel wiring portions 205Ba of the fourth wiring patterns 205B adjacent to the third wiring patterns 204B on one side thereof along the first bending line 218A. In a similar manner, the edges of the third parallel wiring portions 204Ba of the third wiring patterns 204B overlap with the edges of the fourth intersecting wiring portions 205Bb of the fourth wiring patterns 205B adjacent to the third wiring patterns 204B on the other side thereof along the first bending line 218A.

In this state, the edges of the first intersecting wiring portions 202Ab and the edges of the second parallel wiring portions 203Aa are connected to each other with the first electric connection members 210A interposed therebetween. In a similar manner, the edges of the first parallel wiring portions 202Aa and the edges of the second intersecting wiring portions 203Ab are connected to each other with the first electric connection members 210A interposed therebetween.

In a similar manner, the edges of the first intersecting wiring portions 202Bb and the edges of the second parallel wiring portions 203Ba are connected to each other with the first electric connection members 210B interposed therebetween. In a similar manner, the edges of the first parallel wiring portions 202Ba and the edges of the second intersecting wiring portions 203Bb are connected to each other with the first electric connection members 210B interposed therebetween.

In a similar manner, the edges of the third intersecting wiring portions 204Ab and the edges of the fourth parallel wiring portions 205Aa are connected to each other with the second electric connection members 211A interposed therebetween. In a similar manner, the edges of the third parallel wiring portions 204Ba and the edges of the fourth intersecting wiring portions 205Bb are connected to each other with the second electric connection members 211B interposed therebetween.

Accordingly, the group of first wiring patterns 202A and the group of second wiring patterns 203A are serially connected to each other with the first electric connection members 210A interposed therebetween, which constitutes the first wave-shape wiring 213A. In a similar manner, the group of first wiring patterns 202B and the group of second wiring patterns 203B are serially connected to each other with the first electric connection members 210B interposed therebetween, which constitutes the first wave-shape wiring 213B. In a similar manner, the group of third wiring patterns 204A and the group of fourth wiring patterns 205A are serially connected to each other with the second electric connection members 211A interposed therebetween, which constitutes the second wave-shape wiring 214A. In a similar manner, the group of third wiring patterns 204B and the group of fourth wiring patterns 205B are serially connected to each other with the second electric connection members 211B interposed therebetween, which constitutes the second wave-shape wiring 214B.

The first wave-shape wiring 213A and the second wave-shape wiring 214A thus constituted are formed between the first substrate region 208A' and the second substrate region 208B' in such a way that they three-dimensionally intersect with each other in the plane direction and the thickness direction of the flexible insulation substrate 208. In a similar manner, the first wave-shape wiring 213B and the second wave-shape wiring 214B are formed between the first substrate region 208A' and the second substrate region 208B' in such a way that they three-dimensionally intersect with each other in the plane direction and the thickness direction of the flexible insulation substrate 208.

The flexible insulation substrate 208 which is bent along the first bending line 218A so that the first wave-shape wiring 213A and the second wave-shape wiring 214A are formed is further bent along a second bending line 218B.

The second bending line 218B is set at such a position that satisfies the following conditions.

The second bending line 218B is in parallel with the first and second wave-shape wirings 213A and 214A.

The first and second wave-shape wirings 213A and 214A are line-symmetrical to each other relative to the second bending line 218B.

Further, the auxiliary wirings 203 are respectively set at such positions that they are line-symmetrical to each other relative to the second bending line 218B thus set.

The flexible insulation substrate 208 is further bent along the second bending line 218B satisfying the foregoing conditions. At the time, the flexible insulation substrate 208 is bent so that the substrate surface on which the first and second wave-shape wirings 213A and 214A are formed is directed inward. Accordingly, the first and second wave-shape wirings 213A and 214A are stacked on each other in the substrate thickness direction, and the auxiliary wirings 230 abut on each other. The auxiliary wirings 230 thus abutting on each other are bonded to each other by means of the third electric connection member 212. The auxiliary wirings 230 are preferably electrically connected (short-circuited) to a reference potential of a signal transmitted in the flexible printed wiring board. As a result, a shield is formed in an outer periphery of the flexible printed wiring board, which improves the durability against the external electromagnetic noises.

According to the manufacturing method of the preferred embodiment thus far described, the flexible insulation substrate 208 is bent so that the printed wiring board having the pseudo twisted pair structure is formed. Therefore, a flexible printed wiring board having a quality equal to that of the preferred embodiment 2 capable of reducing the generation and influence of the electromagnetic noises in comparison to the conventional flexible printed wiring board can be manufactured without any increase in costs and in a most simplified manufacturing process.

In the flexible printed wiring board manufactured according to the manufacturing method provided by the present preferred embodiment, the pseudo twisted pair structures in which the polarities of the electromagnetic noise radiation are different (directions to which electromagnetic noises are radiated are different) are continuously provided in the thickness direction of the flexible printed wiring board, and the pseudo twit pair structures are disposed so as to be plane-symmetrical to each other relative to the bonding surface of the flexible print wiring substrate (disposed in the mirror-image manner). Therefore, the radiated noises in the cross-sectional direction of the substrate can be further reduced in comparison to the flexible printed wiring board manufactured according to the manufacturing method provided by the preferred embodiment 3.

When the flexible printed wiring board according to the present invention is designed, CAD (computer aided design) is used. The CAD preferably comprises the features of:
1. making wiring drawings of before-bending-states;
2. setting a bending line along which the flexible insulation substrate is bent;
3. making drawings of arrangement states of wiring patterns provided at such positions that the wiring patterns are line-symmetrical to each other relative to the set bending line and also in a state where the flexible insulation substrate is bent along the bending line; and
4. dividing wiring patterns in the bending state into a plurality of groups based on the recognition of portions of the wiring patterns overlapping with each other and the recognition of wiring pattern portions that require electrical connection out of portions of the wiring patterns recognized as overlapping with each other in the bending state.

When the CAD capable of performing the features described above is used, the wirings according to the present invention can be smoothly designed, and a lead time for development can be reduced.

INDUSTRIAL APPLICABILITY

The twisted-pair wiring structure according to the present invention is suitable for a printed wiring board, a flexible printed wiring board and a similar type of board which is required to reduce its tendency to generate radiated electromagnetic noises and be affected by external noises.

What is claimed is:
1. A printed wiring board comprising:
   at least three insulation substrates multilayered on one another;
   at least two first wave-shape wirings, each of the first wave-shape wirings provided between two insulation substrates facing each other included in the at least three insulation substrates;
   at least two second wave-shape wirings, each of the second wave-shaped wirings provided between two insulation substrates facing each other and three-dimensionally intersecting with the first wave-shape wirings in a plane direction and a thickness direction of the at least three insulation substrates; and
   one or a plurality of resist layers, each of the one or the plurality of resist layers provided between the two insulation substrates facing each other, and electrically separating a first wave-shape wiring included in the at least two first wave-shape wirings and a second wave-shape wiring included in the at least two second wave-shape wirings from each other, wherein
   the at least two first wave-shape wirings, the at least two second wave-shape wirings and the one or plurality of resist layers are provided in each of a plurality of interlayer spaces of the at least three insulation substrates, and
   third wave-shape wirings adjacent to each other included in the at least two first wave-shape wirings and fourth wave-shape wirings adjacent to each other included in the at least two second wave-shape wirings in the thickness direction of the at least three insulation substrates are disposed at such positions that the third wave-shape wirings adjacent to each other and the fourth wave-shape wirings adjacent to each other are plane-symmetrical to each other relative to a bonding surface of the at least three insulation substrates.

2. The printed wiring board as claimed in claim 1, wherein the at least two first wave-shape wirings comprises:
one or a plurality of first wiring patterns provided on one of facing surfaces of the two insulation substrates facing each other and constituting intermittent portions in part in the at least two first wave-shape wirings;
one or a plurality of second wiring patterns provided on the other facing surface of the two insulation substrates facing each other and constituting the remaining portions other than the portions of the first wiring pattern in the at least two first wave-shape wirings; and
a first electrical connection member provided between the two insulation substrates facing each other and connecting a first wiring pattern included in the one or a plurality of first wiring patterns and a second wiring pattern included in the one or a plurality of second wiring patterns to each other along the thickness direction of the at least three insulation substrates, and
the at least two second wave-shape wirings comprises:
one or a plurality of third wiring patterns provided on one of facing surfaces of the two insulation substrates facing each other and constituting intermittent portions in part in the at least two second wave-shape wirings,
one or a plurality of fourth wiring patterns provided on the other facing surface of the two insulation substrates facing each other and constituting the remaining portions other than the portions of the third wiring pattern in the at least two second wave-shape wirings; and
a second electrical connection member provided between the two insulation substrates facing each other and connecting a third wiring pattern included in the one or a plurality of third wiring patterns and a fourth wiring pattern included in the one or a plurality of fourth wiring patterns to each other along the thickness direction of the at least three insulation substrates.

3. The printed wiring board as claimed in claim 2, wherein
the one or a plurality of first wiring patterns and the one or a plurality of second wiring patterns serially connected to each other with the first electrical connection member interposed therebetween constitute the at least two first wave-shape wirings, and
the one or a plurality of third wiring patterns and the one or a plurality of fourth wiring patterns serially connected to each other with the second electrical connection member interposed therebetween constitute the at least two second wave-shape wirings.

4. The printed wiring board as claimed in claim 3, wherein
the one or a plurality of first wiring patterns comprises a first parallel wiring portion and a first intersecting wiring portion,
the one or a plurality of second wiring patterns comprises a second parallel wiring portion and a second intersecting wiring portion,
the one or a plurality of third wiring patterns comprises a third parallel wiring portion and a third intersecting wiring portion, and
the one or a plurality of fourth wiring patterns comprises a fourth parallel wiring portion and a fourth intersecting wiring portion,
the first parallel wiring portion and the fourth parallel wiring portion are in parallel with each other, and the second parallel wiring portion and the third parallel wiring portion are in parallel with each other when viewed from the thickness direction of the at least three insulation substrates,
the first intersecting wiring portion and the fourth intersecting wiring portion intersect with each other, and the second intersecting wiring portion and the third intersecting wiring portion intersect with each other when viewed from the thickness direction of the at least three insulation substrates,
the first intersecting wiring portion of the first wiring pattern is connected to the second parallel wiring portion of the second wiring pattern on one side adjacent to the first wiring pattern with the first electrical connection member interposed therebetween, and the first parallel wiring portion of the first wiring pattern is connected to the second intersecting wiring portion of the second wiring pattern on the other side adjacent to the first wiring pattern with the first electrical connection member interposed therebetween, and
the third intersecting wiring portion of the third wiring pattern is connected to the fourth parallel wiring portion of the fourth wiring pattern on one side adjacent to the third wiring pattern with the second electrical connection member interposed therebetween, and the third parallel wiring portion of the third wiring pattern is connected to the fourth intersecting wiring portion of the fourth wiring pattern on the other side adjacent to the third wiring pattern with the second electrical connection member interposed therebetween.

5. The printed wiring board as claimed in claim 4, wherein when viewed from the thickness direction of the at least three insulation substrates, the first parallel wiring portion and the second parallel wiring portion are disposed on substantially the same line, and the third parallel wiring portion and the fourth parallel wiring portion are disposed on substantially the same line.

6. The printed wiring board as claimed in claim 5, wherein when viewed from the thickness direction of the at least three insulation substrates, the first intersecting wiring portion and the third intersecting wiring portion are in parallel with each other, and the second intersecting wiring portion and the fourth intersecting wiring portion are in parallel with each other.

7. The printed wiring board as claimed in claim 1, wherein signals in which phases are electrically different from each other through 180 degrees are driven in the at least two first wave-shape wirings and the at least two second wave-shape wirings.

8. The printed wiring board as claimed in claim 2, wherein any of a thermally-bonding portion between the first wiring pattern and the second wiring pattern, solder, a conductive adhesive and conductive paste constitutes the first electrical connection member, and
any of a thermally-bonding portion between the third wiring pattern and the fourth wiring pattern, solder, conductive adhesive and conductive paste constitutes the second electrical connection member.

9. The printed wiring board as claimed in claim 1, wherein the two insulation substrates facing each other are coupled with each other at one of both ends thereof, and the coupling sections of the insulation substrates are alternately provided at one of both ends thereof, so that the plurality of insulation substrates have a shape of a bent insulation sheet.

10. The printed wiring board as claimed in claim 9, wherein the at least three insulation substrates are flexible substrates.

11. The printed wiring board as claimed in claim 9, wherein auxiliary wirings are provided at sections facing each other on the facing surfaces of first insulation substrates included in the at least three insulation substrates, constituting an interlayer space between the first insulation substrates where the first wave-shape wiring and the second wave-shape wiring are not provided, and these auxiliary wirings are connected, so that the at least three insulation substrates are bonded to each other.

12. The printed wiring board as claimed in claim 11, wherein
the auxiliary wirings are connected to a reference potential of the printed wiring substrate.

13. A printed wiring board manufacturing method comprising:
a first step in which at least three insulation substrates multilayered on one another including first insulation substrate and second insulation substrate are prepared, one or a plurality of first wiring patterns constituting intermittent portions in part in a first wave-shape wiring and one or a plurality of third wiring patterns constituting of intermittent portions in part in a second wave-shape wiring are formed on the first insulation substrate, and one or a plurality of second wiring patterns constituting the remaining portions other than the portions of the first wiring pattern in the first wave-shape wiring and one or a plurality of fourth wiring patterns constituting the remaining portions other than the portions of the third wiring pattern in the second wave-shape wiring are formed on the second insulation substrate; and
a second step in which the first insulation substrate and the second insulation substrate are stacked on each other with a resist layer interposed therebetween so that surfaces thereof on which the wiring patterns are formed face each other, and the first wiring pattern and the second wiring pattern are connected to each other with a first electrical connection member interposed therebetween so that the first wave-shape wiring is formed, and the third wiring pattern and the fourth wiring pattern are connected to each other with a second electrical connection member interposed therebetween so that the second wave-shape wiring is formed in such a way that the second wave-shape wiring three-dimensionally intersects with the first wave-shape wiring in a plane direction and a thickness direction of the first and second insulation substrates, wherein
in the first step, the first wave-shape wiring, the second wave-shape wiring and the resist layer are formed in each of a plurality of interlayer spaces of the insulation substrates, and
third wave-shape wirings adjacent to each other included in the at least two first wave-shape wirings and fourth wave-shape wirings adjacent to each other included in the at least two second wave-shape wirings in the thickness direction of the at least three insulation substrates are formed at such positions that the third wave-shape wirings adjacent to each other and the fourth wave-shape wirings adjacent to each other are plane-symmetrical to each other relative to a bonding surface of the at least three insulation substrates.

14. The printed wiring board manufacturing method as claimed in claim 13, wherein
the first wiring pattern and the second wiring pattern are serially connected to each other with the first electrical connection member interposed therebetween so that the first wave-shape wiring is formed, and the third wiring pattern and the fourth wiring pattern are serially connected to each other with the second electrical connection member interposed therebetween so that the second wave-shape wiring is formed in the second step.

15. The printed wiring board manufacturing method as claimed in claim 14, wherein
the first wiring pattern comprising a first parallel wiring portion and a first intersecting wiring portion, the second wiring pattern comprising a second parallel wiring portion and a second intersecting wiring portion, the third wiring pattern comprising a third parallel wiring portion and a third intersecting wiring portion, and the fourth wiring pattern comprising a fourth parallel wiring portion and a fourth intersecting wiring portion are formed at positions where the first parallel wiring portion and the fourth intersecting wiring portion are in parallel with each other, the second parallel wiring portion and the third intersecting wiring portion are in parallel with each other, the first intersecting wiring portion and the fourth intersecting wiring portion intersect with each other, and the second intersecting wiring portion and the third intersecting wiring portion intersect with each other when viewed from the thickness direction of the at least three insulation substrates in the first step, and
the first intersecting wiring portion of the first wiring pattern is connected to the second parallel wiring portion of the second wiring pattern on one side adjacent to the first wiring pattern with the first electrical connection member interposed therebetween, the first parallel wiring portion of the first wiring pattern is connected to the second intersecting wiring portion of the second wiring pattern on the other side adjacent to the first wiring pattern with the first electrical connection member interposed therebetween, the third intersecting wiring portion of the third wiring pattern is connected to the fourth parallel wiring portion of the fourth wiring pattern on one side adjacent to the third wiring pattern with the second electrical connection member interposed therebetween, and the third parallel wiring portion of the third wiring pattern is connected to the fourth intersecting wiring portion of the fourth wiring pattern on the other side adjacent to the third wiring pattern with the second electrical connection member interposed therebetween in the second step.

16. The printed wiring board manufacturing method as claimed in claim 15, wherein
when viewed from the thickness direction of the at least three insulation substrates, the first parallel wiring portion and the third parallel wiring portion are formed on substantially the same line, and the second parallel wiring portion and the fourth parallel wiring portion are formed on substantially the same line in the first step.

17. The printed wiring board manufacturing method as claimed in claim 16, wherein
the first intersecting wiring portion and the third intersecting wiring portion are formed in parallel with each other, and the second intersecting wiring portion and the fourth intersecting wiring portion are formed in parallel with each other when viewed from the thickness direction of the at least three insulation substrates in the first step.

18. The printed wiring board manufacturing method as claimed in claim 13, wherein
a sheet-shape insulation substrate obtained in such a way that third insulation substrates are coupled with each other at one of both ends of two insulation substrates adjacent to each other included in the third insulation substrates, and the coupling sections of the two insulation substrates are alternately provided at one of both ends thereof so that the third insulation substrates are formed into a sheet shape is prepared as the at least three insulation substrates in the first step.

19. The printed wiring board manufacturing method as claimed in claim 18, wherein a flexible substrate is used as the at least three insulation substrates in the first step.

20. The printed wiring board manufacturing method as claimed in claim 18, wherein auxiliary wirings are formed at sections facing each other on facing surfaces of fourth insulation substrates included in the at least three insulation substrates, constituting an interlayer space between the fourth insulation substrates where the first wave-shape wiring and the second wave-shape wiring are not provided in the first step, and these auxiliary wirings are connected so that the fourth insulation substrates are bonded to each other in the second step.

21. An electric device comprising:

the printed wiring board as claimed in claim 1; and a signal source which drives signals in which phases are electrically different through 180 degrees in the first wave-shape wiring and the second wave-shape wiring.

* * * * *

UNITED STATES PATENT AND TRADEMARK OFFICE
CERTIFICATE OF CORRECTION

PATENT NO. : 8,119,919 B2
APPLICATION NO. : 12/376862
DATED : February 21, 2012
INVENTOR(S) : Hiroyoshi Tagi et al.

It is certified that error appears in the above-identified patent and that said Letters Patent is hereby corrected as shown below:

On the title page, below the data for Item "(65)" and before Item "(51)", insert the following:

-- (30) Foreign Application Priority Data

October 24, 2006 (JP).......2006-288493 --.

Signed and Sealed this
Seventeenth Day of July, 2012

David J. Kappos
*Director of the United States Patent and Trademark Office*